United States Patent
Bailly

(10) Patent No.: US 9,735,310 B2
(45) Date of Patent: Aug. 15, 2017

(54) DAMAGE-AND-RESIST-FREE LASER PATTERNING OF DIELECTRIC FILMS ON TEXTURED SILICON

(71) Applicant: Mark Scott Bailly, Chandler, AZ (US)

(72) Inventor: Mark Scott Bailly, Chandler, AZ (US)

(73) Assignee: ARIZONA BOARD OF REGENTS ON BEHALF OF ARIZONA STATE UNIVERSITY, Scottsdale, AZ (US)

(*) Notice: Subject to any disclaimer, the term of this patent is extended or adjusted under 35 U.S.C. 154(b) by 0 days.

(21) Appl. No.: 15/280,247

(22) Filed: Sep. 29, 2016

(65) Prior Publication Data

US 2017/0117432 A1    Apr. 27, 2017

Related U.S. Application Data

(60) Provisional application No. 62/286,914, filed on Jan. 25, 2016, provisional application No. 62/244,516, filed on Oct. 21, 2015.

(51) Int. Cl.

| | |
|---|---|
| H01L 31/0224 | (2006.01) |
| H01L 21/283 | (2006.01) |
| H01L 31/18 | (2006.01) |
| H01L 31/028 | (2006.01) |
| H01L 31/0216 | (2014.01) |
| H01L 31/068 | (2012.01) |

(52) U.S. Cl.
CPC ........ *H01L 31/1804* (2013.01); *H01L 31/028* (2013.01); *H01L 31/02167* (2013.01); *H01L 31/022441* (2013.01); *H01L 31/0682* (2013.01)

(58) Field of Classification Search
CPC .................................. H01L 21/02697; H01L 31/022425–31/022458
See application file for complete search history.

(56) References Cited

U.S. PATENT DOCUMENTS

| | | | |
|---|---|---|---|
| 4,992,847 A * | 2/1991 | Tuckerman | H01L 23/13 257/623 |
| 5,011,567 A * | 4/1991 | Gonsiorawski | H01L 31/022425 136/256 |
| 5,017,509 A * | 5/1991 | Tuckerman | H01P 11/003 438/622 |

(Continued)

*Primary Examiner* — Selim Ahmed
*Assistant Examiner* — Molly Reida
(74) *Attorney, Agent, or Firm* — Blakely Sokoloff Taylor & Zafman LLP

(57) ABSTRACT

In accordance with embodiments disclosed herein, there are provided methods and systems for implementing damage-and-resist-free laser patterning of dielectric films on textured silicon. For example, in one embodiment, such means include means for depositing a Silicon nitride (SiNx) or SiOx (silicon oxide) layer onto a crystalline silicon (c-Si) substrate by a Plasma Enhanced Chemical Vapor Deposition (PECVD) processing; depositing an amorphous silicon (a-Si) film on top of the SiNx or SiOx layer; patterning the a-Si film to define an etch mask for the SiNx or SiOx layer; removing the SiNx or SiOx layer via a Buffered Oxide Etch (BOE) chemical etch to expose the c-Si surface; removing the a-Si mask with a hydrogen plasma etch in a PECVD tool to prevent current loss from the mask; and plating the exposed c-Si surface with metal contacts. Other related embodiments are disclosed.

19 Claims, 15 Drawing Sheets

(56) References Cited

U.S. PATENT DOCUMENTS

| | | | | |
|---|---|---|---|---|
| 2009/0239331 A1* | 9/2009 | Xu | ............... | H01L 31/022425 |
| | | | | 438/98 |
| 2014/0370650 A1* | 12/2014 | Moslehi | ............... | H01L 31/18 |
| | | | | 438/98 |
| 2016/0126369 A1* | 5/2016 | Su | ............... | H01L 31/02168 |
| | | | | 136/256 |

* cited by examiner

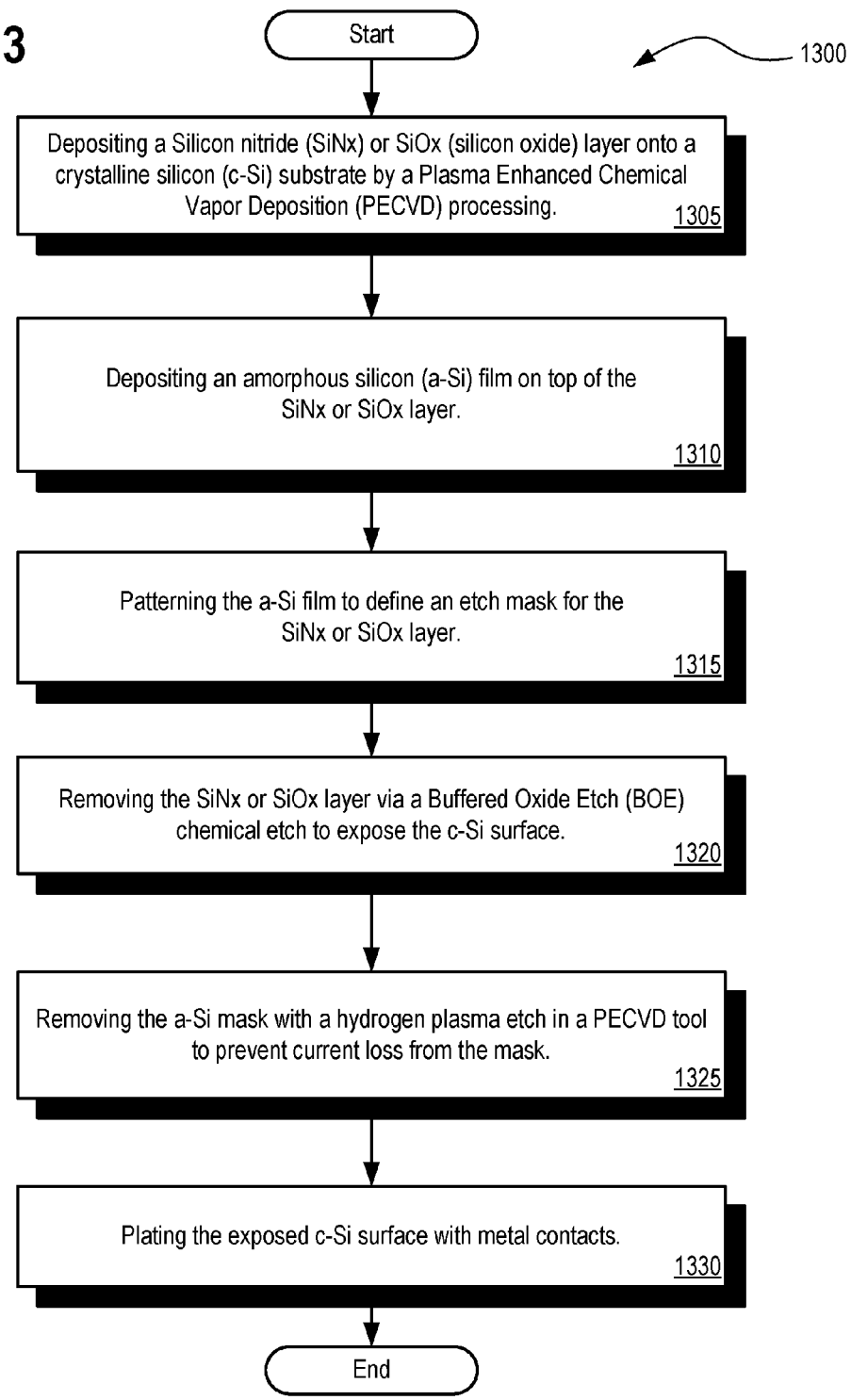

DAMAGE-AND-RESIST-FREE LASER PATTERNING OF DIELECTRIC FILMS ON TEXTURED SILICON

CLAIM OF PRIORITY

This patent is related to and claims priority to the U.S. Provisional Patent Application No. 62/244,516 filed Oct. 21, 2015 and entitled "Damage and Resist-Free Laser Patterning of Dielectric Films on Textured Silicon," and is related to and claims priority to the U.S. Provisional Patent Application No. 62/286,914 filed Jan. 25, 2016, the entire contents of which are incorporated herein by reference.

GOVERNMENT RIGHTS AND GOVERNMENT AGENCY SUPPORT NOTICE

This invention was funded by a government agency. This invention was made with government support under NSF CA No. EC-1041895 awarded by the National Science Foundation. The government has certain rights in the invention.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

Embodiments of the invention relate generally to the field of materials, and more particularly, to methods and systems for damage-and-resist-free laser patterning of dielectric films on textured silicon.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed inventions.

Plasma Enhanced Chemical Vapor Deposition (PECVD) and PECVD tools enable a process by which thin films are deposited from a gas state (vapor) to a solid state onto a substrate by chemical reactions which occur after creation of a plasma of the reacting gases. The plasma is generally created by RF (AC) frequency or DC discharge between two electrodes, the space between which is filled with the reacting gases.

Dielectric films such as Silicon-Nitride and Silicon-Dioxide are used in the production of silicon solar cells. It is desirable, for the purpose of creating selective, well defined structures and metallizations to pattern these films on the surface of alkaline textured silicon. An industrially feasible method for patterning these films is to remove them with a laser. Presently known and conventional laser removal processes unfortunately causes damage to the surface of the silicon. Such processes are the best known techniques in the current state of the art and therefore, a balance is made between the extent of film removal via laser and resulting damage to the underlying silicon. For instance, greater removal of the layers exposes more silicon, and thus increases efficiency of the cell, whilst simultaneously causing increasing amounts of damage to the silicon, thus reducing efficiency of the cell.

Removal of the films by any means without causing damage or by causing less damage to the underlying silicon therefore improves efficiency of the cell, resulting in greater power generation, assuming equal amounts of the film are removed.

Laboratory demonstrated chemical techniques (photolithography) have been demonstrated to remove greater amounts of the thin layers without the use of lasers thus resulting in little to no damage to the underlying silicon which in turn results in optimal efficiency and power generation, however, such chemical methods do not scale to industrial manufacturing at costs that are feasible for solar production, and therefore, have proven undesirable for commercial manufacturers which must compete with lower-cost providers of silicon cells to the marketplace.

A lower cost laser removal process which provides sufficient layer removal and reduces damage to the underlying silicon is needed.

The present state of the art may therefore benefit from systems and methods for implementing damage-and-resist-free laser patterning of dielectric films on textured silicon as is described herein.

BRIEF DESCRIPTION OF THE DRAWINGS

Embodiments are illustrated by way of example, and not by way of limitation, and can be more fully understood with reference to the following detailed description when considered in connection with the figures in which:

FIG. 13 is a flow diagram illustrating a method for implementing damage-and-resist-free laser patterning of dielectric films on textured silicon in accordance with described embodiments.

DETAILED DESCRIPTION

Figure 1A:
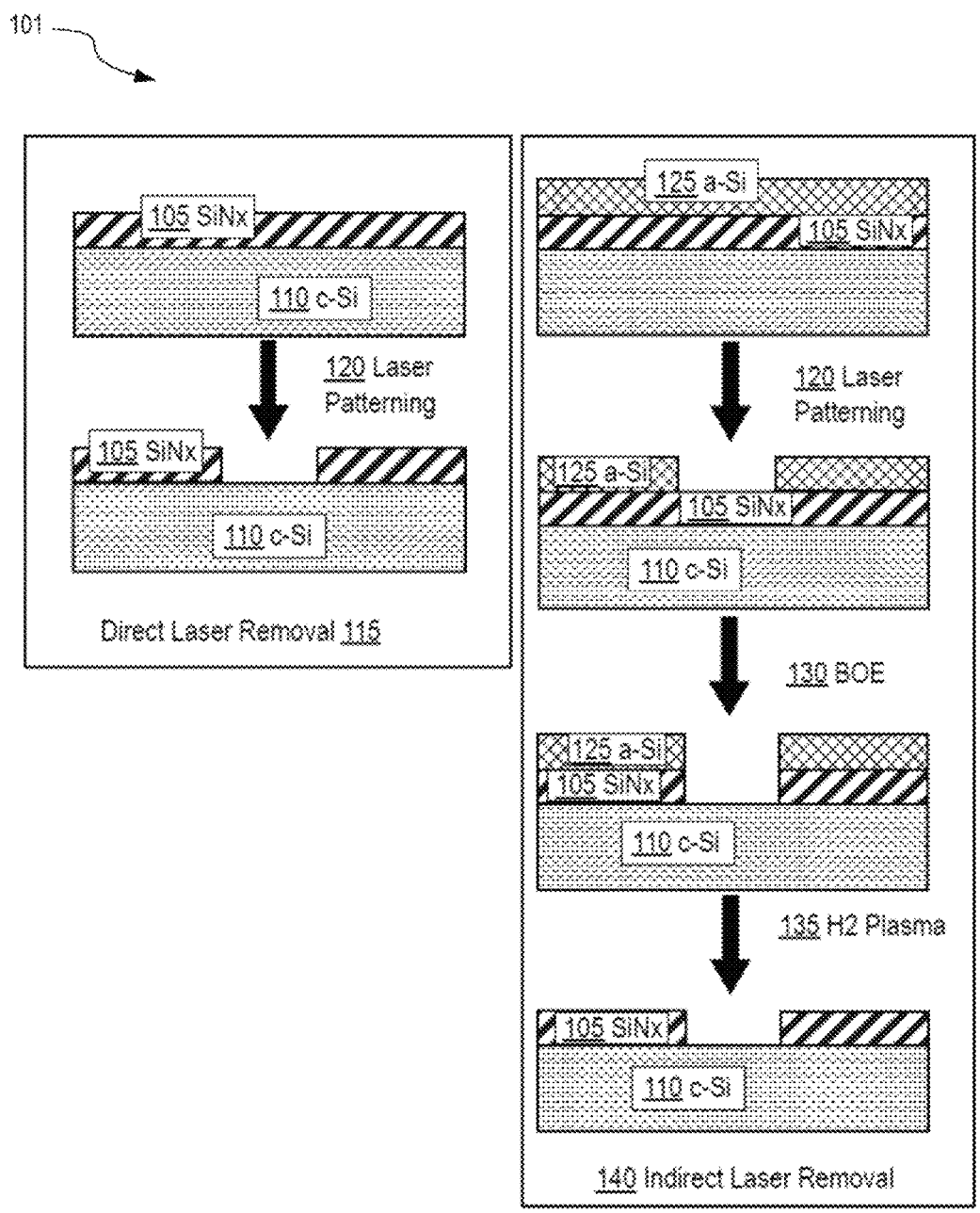
FIG. 1A illustrates both direct and indirect laser removal processing schemes in accordance with the described embodiments.

Described herein are methods and systems for implementing damage-and-resist-free laser patterning of dielectric films on textured silicon. For example, there are described in accordance with certain embodiments, means for depositing a Silicon nitride (SiNx) or SiOx (silicon oxide) layer onto a crystalline silicon (c-Si) substrate by a Plasma Enhanced Chemical Vapor Deposition (PECVD) processing; depositing an amorphous silicon (a-Si) film on top of the SiNx or SiOx layer; patterning the a-Si film to define an etch mask for the SiNx or SiOx layer; removing the SiNx or SiOx layer via a Buffered Oxide Etch (BOE) chemical etch to expose the c-Si surface; removing the a-Si mask with a hydrogen plasma etch in a PECVD tool to prevent current loss from the mask; and plating the exposed c-Si surface with metal contacts.

By using Plasma Enhanced Chemical Vapor Deposition (PECVD) $SiN_x$ or $SiO_x$ is deposited onto c-Si. Dielectric films may also be thermally grown (SiO2) or deposited with techniques such as Atomic Layer Deposition (ALD), thermal evaporation, and sputtering. Other films include Al2O3, MgF, etc. In order to pattern this film for metallization without damaging the underlying c-Si a thin layer of a-Si is deposited on top of the $SiN_x$ or $SiO_x$. The a-Si film is very susceptible to laser removal, but is insensitive to a Buffered Oxide Etch (BOE) (which contains hydrofluoric acid). The underlying $SiN_x$ or $SiO_x$ film is sensitive to BOE, but not sensitive to the laser. By patterning the a-Si film an etch mask is defined for the $SiN_x$ or $SiO_x$ which can then later be removed by a low power hydrogen plasma in the PECVD tool. The resultant damage free surface may then be plated with metal or exposed to other selective processes.

Using a resist free process for patterning $SiN_x$ and $SiO_x$ with a laser thus provides a robust process when applied to textured surfaces on Si with no visible damage to the c-Si is observed with SEM imaging and near complete film removal at the laser sites. Such a process is therefore practical for use with selective contact creation, selective diffusion, and other processes requiring patterned dielectric films. Furthermore, such a process enables higher efficiency c-Si solar devices through manufacture of damage-free metal plating and region specific device formation over the conventional methodologies and techniques which result in only partial film removal and extensive laser induced damage to the underlying silicon cells.

Laser patterning of thin films such as $SiN_x$, $SiO_x$, and a-Si is desirable for solar cell production as it allows for patterning similar to what is achieved with photolithography at a fraction of the cost and may be used for processes such as contact patterning and selective doping. Unfortunately, a major problem with laser ablation processes is the c-Si damage which is induced by the laser. While 'low damage' laser patterning is trivial on smooth surfaces, performing such patterning on surfaces textured by standard alkaline etch processes prove far more difficult and problematic.

Orders of magnitude variation in laser intensity across pyramidal structures 5-10 microns in size have been demonstrated. Such variations in laser pulse intensity are detrimental towards the ablation process resulting in a demonstrated decrease in generation current (JG) and open circuit voltage (Voc) with an increase in laser pulse intensity. Still further, non-uniform heating which occurs results in deep threading dislocations at the peaks of the pyramids, as deep as 1 micron.

High laser powers likewise create damage in c-Si. Consequently, ablation of thin films with high laser ablation thresholds typically result in damaged c-Si. Indirect removal of $SiN_x$ by patterning an a-Si etch mask with an 800 nm 140 femtosecond laser is therefore described herein. Due to the nature of the laser, plasma ablation of the a-Si mask is achievable through the generation of energetic electrons via impact ionization.

In accordance with certain described embodiments, crystalline silicon is textured with an alkaline etch, resulting in pyramidal structures in the 1-6 micron regime. According to such an embodiment, ~78 nm of $SiN_x$ are deposited with $NH_3$ and $SiH_4$ in a $N_2$ dilute plasma at ~320 degrees Celsius. Following the $SiN_x$ deposition, a ~20 nm layer of a-Si is deposited with a $SiH_4$ in an $H_2$ dilute plasma at ~270 degrees Celsius. The resulting film stack is then used with a laser that is absorbed in the a-Si layer. With the established film stack, the top layer of the film stack is ablated with a laser, in which ablating the film constitutes removal of the film from the stack. Both the a-Si and c-Si absorb the laser, however, the weakly bound nature of the a-Si leads to vaporization of the film before visible damage is done to the c-Si lattice.

FIG. 1A illustrates both direct laser removal 115 and indirect laser removal 140 processing schemes in accordance with the described embodiments. In particular, there is depicted on the left a direct removal scheme 115 and depicted on the right is an indirect laser removal scheme 140.

Direct laser removal 115 of $SiN_x$ 105 depicted on the left details the processing scheme for direct removal of $SiN_x$ from the c-Si 110 layer at lower power conditions with an 800 nm laser causing photon vaporization of the underlying c-Si 110. Vaporization of the c-Si 110 substrate can be a damage intensive process, especially with the laser intensity variation introduced with texturing processes.

Conversely, the indirect laser removal 140 process of $SiN_x$ 105 utilizes a film which can directly absorb the laser under normal conditions. It is therefore possible to remove that film without relying on vaporization of the underlying c-Si 110 substrate. Once the laser sensitive a-Si 125 mask is patterned with the laser at laser patterning operation 120, the $SiN_x$ can be patterned with a Buffered Oxide Etch (BOE) at operation 130 owing to the chemical sensitivity of $SiN_x$ to hydrofluoric acid (HF).

Given the high intensity and short duration of a femtosecond laser, calculating the instantaneous intensity of the laser, using the assumption that the laser has a flat-top profile, is given as:

$$P_d = \frac{P_{avg}}{n * t_p * f},$$

where $P_d$ is the instantaneous power density, where $P_{avg}$ is the measured time average power, where n is the number of triggered pulses per pulse train, where $t_p$ is the duration of the pulse, and where f is the frequency of the pulse trains from the laser system.

The intensity variation of the laser with a textured substrate complicates the power optimization process for $SiN_x$ direct laser removal 115 and $SiN_x$ indirect laser removal 140 processes. For the direct laser removal 115 process, an increase in the film removal is accompanied by a corresponding increase in damage. Greater film removal improves efficiency of the cell, however, the greater damage caused to the cell negates and ultimately overcomes the efficiency improvements gained. Though a balance between film removal and silicon damage may be attained, there is nevertheless a limit to the efficiency of a resulting cell due to such a tradeoff.

With the $SiN_x$ indirect laser removal 140, undercutting (e.g., chemical etching via the BOE 130 operation beneath a mask, at the perforated sites) of the a-Si 125 mask at the lasing site is utilized to compensate for residual film.

Described in greater detail below and depicted via the following images are a series of samples, all of which are generated from p-type mono-crystalline boron doped wafers with a bulk resistivity of 1-3 Ω·cm with a thickness of 170-200 microns. The substrates are pseudo square and measure 156+0.5 mm. Film depositions are performed with an Applied Materials Precision 5000 Plasma Enhanced Chemical Vapor Deposition (PECVD) tool. Laser processing of the thin films is performed with a 140 femtosecond laser with a repetition rate of 5 kHz. Each repetition of the laser generates a pulse train of approximately 6 laser pulses separated by 12.5 nanoseconds.

Intensity control of the laser may be managed using neutral density reflective filters. When fine control is required, multiple filters are used causing pulse echoing <1% of the transmitted power. For the processes described, such effects are purposefully neglected as the ablation process is attributed to the peak laser intensity, not the absorbed power, which remains unaffected by sub-peak intensity pulse echoing. Pulse overlap may be controlled by the scanning speed of the flying optics used to steer and focus the laser over the Si substrate.

As used herein, 'partial ablation' is defined as the complete film removal over the defined laser spot area less than 70%. Regions covered in a thin layer of $SiN_x$ are considered as non-removed sites and are observable in the Scanning Electron Microscope (SEM) images depicted via the subsequent figures.

The described processes are of critical importance to solar cell or photovoltaic cell manufacturing. Solar cells, such as those depicted at FIG. 5, elements 501 and 502 are electrical devices which convert the energy of light directly into electricity by the photovoltaic effect, which is a physical and chemical phenomenon. Solar or photovoltaic cells are one type of photoelectric cells representing a class of devices having electrical characteristics, such as current, voltage, or resistance, that vary when exposed to light. Such solar or photovoltaic cells are the building blocks of photovoltaic modules, otherwise known as solar panels which are revolutionizing the energy market today.

Operation of a photovoltaic (PV) cell requires 3 basic attributes: First, the absorption of light, generating either electron-hole pairs or excitons. Secondly, the separation of charge carriers of opposite types. And thirdly, the separate extraction of those carriers to an external circuit.

Principally therefore, the absorption of greater amounts of light energy into a solar cell will improve the output and the operational efficiency of the solar cell. Stated more simplistically, it is desirable to get more light into a solar cell as doing so increases the amount of electricity that can be generated in a given footprint or space.

Typically, there are contacts on the front of a solar cell and these contacts are made of metal. Because the metal contacts themselves are not transparent to light, any light that hits the metal contacts is not absorbed by the solar cell as it is reflected away. In such a way, the contacts reduce the amount of power that the solar cell potentially could have generated if not for the light hitting these metal contacts.

In accordance with the described embodiments therefore, the conventional metal contacts are reduced in size to make finer metal contacts which in turn overcomes some of the resistance to light absorption and increases the amount of light energy received by the photovoltaic cells by decreasing the amount of light blocked by such contacts.

Consider for instance having many 30 micron contacts versus the same number of 150 micron contacts. When aggregated together, the reduction in total surface area attributable to the smaller contacts contributes to a measurable increase in light absorption and therefore greater electrical output for an otherwise identical photovoltaic cell.

Eventually, making the metal contacts smaller and smaller and smaller will stop making any appreciable difference; however, such a limit has not yet been reached in the present state of the art.

The leading technology by which the metallic contacts are formed is through a process called screen printing, in which there is a metal mesh screen through which paste is pushed to assume the shape of the emulsion on the metal mesh screen. Using such a technology, the minimum size attainable for the contacts is in the range of approximately 80 to 100 microns reliably.

Conversely, practice of the disclosed embodiments permits the creation of metal contacts of significantly smaller size, reduced from the present 80 to 100 microns range to less than 20 microns reliably. Such a size represents a significant improvement in light absorption over present technologies and is reaching the point where smaller contacts yield negligible improvement due to the diminishing returns alluded to above. While a 10 micron contact may be negligibly better in terms of efficiency, the gains are insignificant compared to the improvement gains achieved by reducing the metal contact size from the present 80 to 100 microns range to less than 20 microns.

Conventional methodologies utilize a process called photolithography to create the metallic contacts on the front of the photovoltaic cells, however, as is described in detail here, a laser process supplants the conventional photolithography process permitting the creation of smaller and finer metallic contacts than previously possible and additionally enabling the process to be conducted at an industrial scale.

By scanning the laser rapidly across the surface of a potential solar cell being manufactured it is possible to create the necessarily fine sub-20 micron contacts through a process called light-induced plating. Through such a process, a non-conductive film is first placed onto the top of the solar cell after which laser patterning removes portions of the non-conductive film and then the light-induced plating process causes metal to accumulate where the non-conductive film has been removed via the laser patterning.

Unlike prior laser patterning processes, embodiments described herein utilize both a different laser and a different type of film removal process. For instance, prior solutions involve the removal of a non-conductive film from a surface with an ultraviolet (UV), very short, pico-second pulsed laser. Such a laser removes silicon nitride though a thermal process. More particularly, the energy absorbed in the silicon nitride non-conductive film produces just so much heat that the film is removed in that area.

Silicon nitride non-conductive film has a melting temperature of over 2,000 degrees C. and is layered on top of a silicon material which has a melting temperature of just over 1400 degrees. Unfortunately, by utilizing the ultraviolet pico-second pulsed laser for the purposes of film removal, there is as a result of the exposure to the heat generated not only removal of the non-conductive film in the desired area, but also significant damage induced into the underlying silicon itself.

Solar cells are intentionally rough with an intentionally design induced alkaline texture which increases their efficiency and thus provides an appreciable increase in output current. If the surface is polished or melted smooth then the surface becomes increasingly reflective and simply reflects a greater portion of the light energy received rather than absorbing the light to produce electricity.

Unfortunately, a significant problem with such texturing is that removal of a very thin film on the order of approximately 80 nanometers through conventional laser causes the laser light which reaches the textured surface to bounce around producing an order of magnitude in variation of the laser intensity. Consequently, at some points there is a very high laser intensity whereas at other points, there is very low laser intensity. The points receiving exceedingly high laser intensity result in damage to the silicon surface in addition to removal of the film whereas the points receiving too low of laser intensity result in no damage but unfortunately, also results in a non-removal of the film.

These defects manifest themselves as either point defects, threading defects into the silicon, or trench defects observable within the silicon. For instance, one type of defect causes ridging all the way up the pyramidal structures formed by the intentionally design induced alkaline texture, in which the ridging occurs at the wavelength of the laser that utilized with the depth of the defect being a function of the wavelength in addition to a function of the intensity of the laser light.

Consider for instance an ultraviolet pico-second pulsed laser in the range of 350 to 430 nanometers in wavelength. Such a process will result in a deep ridge in the silicon repeating approximately every 400 nanometers.

Problematically, these ridges disrupt the operational efficiency of the manufactured photovoltaic cell. Such a cell as two main regions, a first region of a material that prefers the absence of an electron, a hole, and then also a very thin top surface of a material made to prefer electrons.

The first region which prefers the absence of an electron usually varies between, approximately 400 nanometers and 1,000 nanometers in thickness. Conversely, the second region which prefers the presence of an electron and which forms the top surface, must be protected as any damage makes it less efficient as it is more difficult for the current to reach the contacts and thus reduces electrical power output.

Moreover, consider instances where there is damage all the way through to the emitter or even partially through the emitter. Such a defect in the electron region results in a parasitic shunt resistance, which is a non-ideal effect. A parasitic shunt resistance in photovoltaic cells creates a resistive effect which will reduce the efficiency of the solar cell by dissipating power in the resistances. Consequently, the solar cell is going to consume power and a portion of its energy will heat up the solar cell rather than generating electricity.

It is therefore in accordance with the described embodiments that a sacrificial a-Si 125 layer or mask is introduced by the indirect laser removal 140 process which is not a part of the conventional direct laser removal 115 processes. Such a layer is counter-intuitive because it necessitates an additional step.

Purposefully introduced texturing effects make removal of the thin SiNx 105 film very difficult without damaging the underlying c-Si 110 layer. The conventional direct laser removal 115 processes for the removal of the SiNx 105 film from smooth surfaces are typically sufficient as there is no variation of intensity of the laser hitting the smooth surface. Unfortunately, such direct laser removal 115 processes are not sufficient when the SiNx 105 layer is to be removed from an underlying textured c-Si 110 surface as described herein due to the texturing inducing massive laser intensity variation as described above.

In accordance with the described embodiments, the sacrificial layer may be the a-Si 125 thin film layer as depicted at FIG. 1, however, the sacrificial layer may be other materials which are sensitive to a removal process. For instance, as depicted, the a-Si 125 thin film is sensitive to laser removal whereas the other film, the silicon nitride SiNx 105 is a non-conductive film which is not sensitive to the laser removal. Because the top layer is sensitive to the laser removal and the lower non-conductive film SiNx layer is not sensitive, the top sacrificial layer is patterned at the top surface to expose the substrate of the potential solar cell. In so doing, the pattern induced into the top film is then set into the bottom film.

It is then necessary to remove the sacrificial a-Si 125 layer so that it does not alter the optical properties and the conductive properties of the solar cell being manufactured.

According to particular embodiments, the sacrificial a-Si 125 layer is placed upon the substrate via a screen printing process which is then lithographically exposed to light.

According to another embodiment, the sacrificial a-Si 125 layer is printed upon the substrate and then patterned with a laser. However, the printing operation introduces yet another operation in to the process and may therefore represent a less preferred method.

According to a particular embodiment, whatever tool or process is utilized to place the SiNx 105 layer is also utilized to place the a-Si 125 sacrificial layer. According to another embodiment, both the SiNx 105 layer and the a-Si 125 sacrificial layer are placed in the same step or operation by changing gas flows during the operation.

For instance, according to particular embodiments, the gases utilized by the tool to place the layers are available whether or not they are typically utilized for the process. For example, a tool capable of placing down silicon nitride can also place down the a-Si sacrificial layer through a change in gas flows and can place the a-Si sacrificial thin film on top of the silicon nitride layer during the same operation simply by changing the gas flows.

Figure 1B:
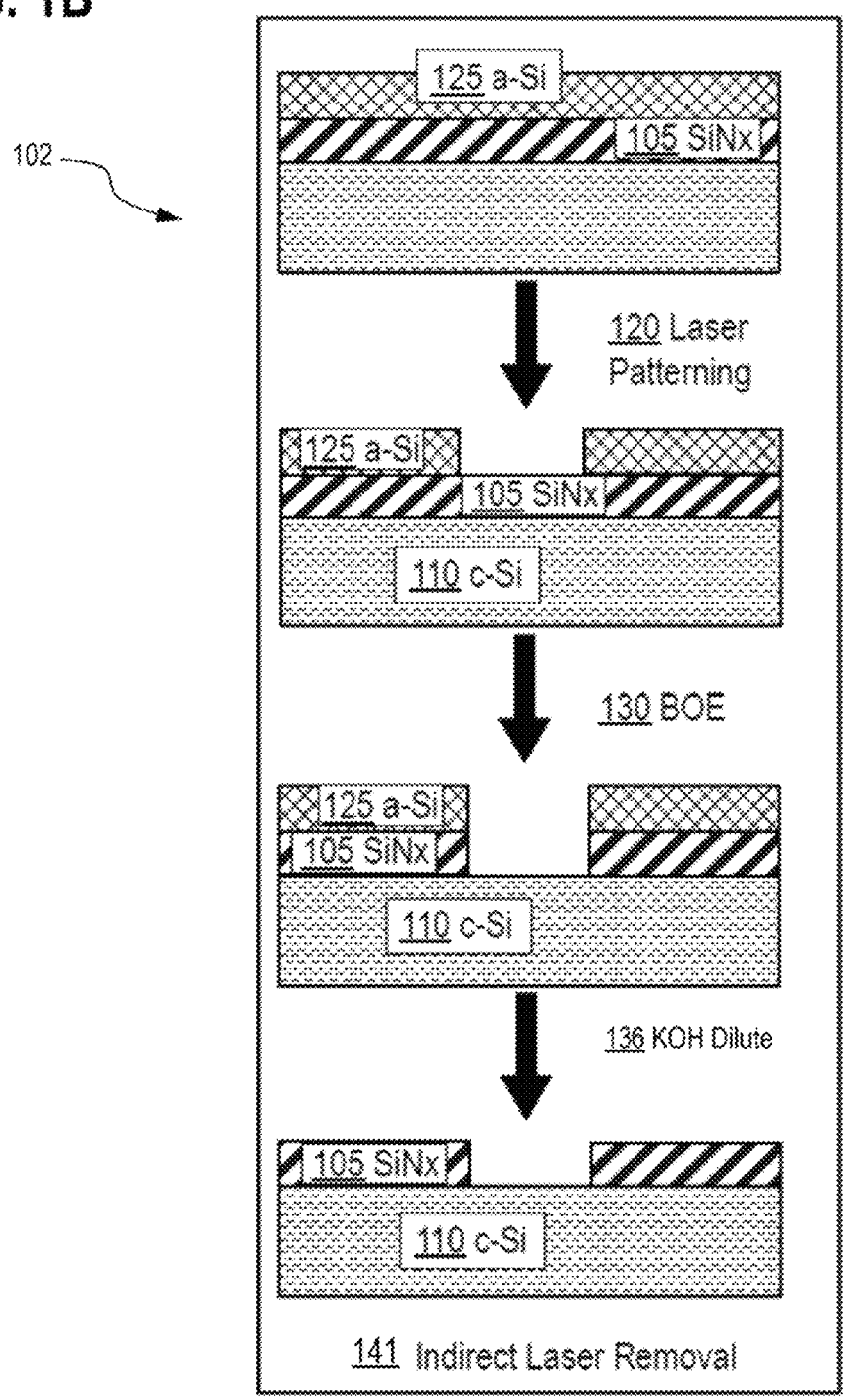
FIG. 1B illustrates an alternative indirect laser removal processing scheme in accordance with the described embodiments.

FIG. 1B illustrates an alternative indirect laser removal 141 processing scheme in accordance with the described embodiments. In particular, according to such an alternative embodiment, a low level plasma etch is not utilized. For instance, operation 135 depicting the H2 plasma from FIG. 1A is replaced with a different operation at FIG. 1B. According to such an embodiment, alternative processing for indirect laser removal 414 of silicon nitride with the laser process begins with depositing the amorphous silicon (a-Si) 125 mass on top of the Silicon Nitride (SiNx) 125 and at operation 120 laser patterning creates the desired mask. According to such an alternative embodiment the patterned solar cell under manufacture is then exposed to a buffered oxide etch (BOE) at operation 120 which takes the laser patterned mask from the amorphous silicon (a-Si) 125 and sets it into the silicon nitride (SiNx) 105, however, rather than utilizing the hydrogen plasma at operation 135 from FIG. 1A, the operation is replaced with a dilute Potassium Hydroxide (KOH) operation 136 as depicted at FIG. 1B.

The low level plasma etch operation of FIG. 1A accelerates protons at the surface with a reactive ion etch tool, however, certain manufacturing facilities may not have such a reactive ion etch tool and therefore, the dilute Potassium Hydroxide (KOH) operation 136 may be preferred for certain implementations to attain the same result. Notably, both the dilute KOH 136 of FIG. 1B and the hydrogen plasma etch operation at element 135 of FIG. 1A work effectively well.

Figure 2:
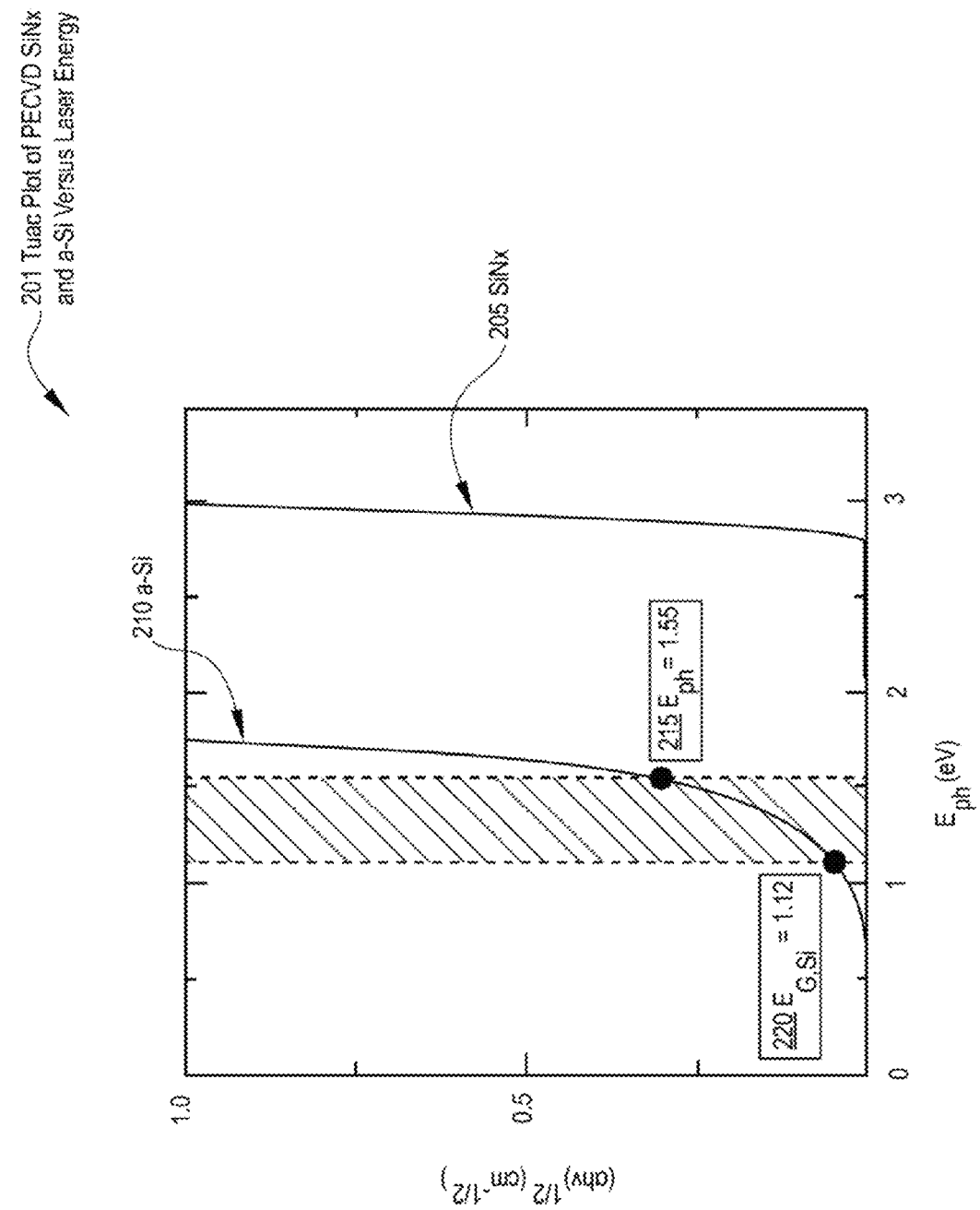
FIG. 2 depicts film bandgaps in accordance with the described embodiments.

FIG. 2 depicts film bandgaps in accordance with the described embodiments.

Specifically depicted is a Tauc plot 201 of PECVD $SiN_x$ (element 205) and a-Si (element 210) compared to the photon energy of the laser and the bandgap ($E_G$) of c-Si. The crosshatched region indicates where both the film and c-Si exhibit direct absorption of the femto-second laser.

Bandgaps of $SiN_x$ and a-Si films are have been determined to be 2.8+0.05 and 1.4+0.1 eV, respectively. The value of $E_G$ for direct allowed transitions is extrapolated by a sharp increase in ($\alpha h\nu$). For $SiN_x$ this increase is distinct, making the determination of the bandgap trivial. With the a-Si film, the increase was gradual, making for a more subjective analysis of the bandgap. Films with $E_G$<1.55 eV at element 215 allow for direct absorption of the laser, making ablation of the film easier. Films with 1.12<$E_G$<1.5 eV at element 220, require a power optimization to avoid excessive absorption in the c-Si substrate to avoid damage.

According to a particular embodiment the a-Si sacrificial layer is an amorphous silicon differentiated from the silicon nitride as the amorphous silicon a-Si sacrificial layer is void or substantially void of measurable quantities of nitrogen. As a result, the amorphous silicon a-Si sacrificial layer presents optical characteristics which are different from the underlying silicon nitride layer which can be exploited. More particularly, the amorphous silicon a-Si sacrificial layer absorbs light more strongly than the silicon nitride.

The Tuac Plot 201 of PECVD SiNx and a-Si Versus Laser Energy is also called a Lorenz plot and the plot having both of the different films demonstrates the optical absorption characteristics of the two different films, both the silicon nitride layer and the amorphous silicon a-Si sacrificial layer.

At the silicon nitride 205 plot there is observable a very wide-bandgap material meaning that it does not absorb light very well, which is beneficial as the layer is being placed at a top surface of a solar cell where the intention is for the solar cell to absorb the light and not the film on top. However, one problem with silicon nitride is that because of the wide-bandgap film, the silicon nitride also does not absorb the laser energy well either and consequently, patterning the silicon nitride is very challenging.

It is therefore in accordance with described embodiments that an ultraviolet laser is utilized for the patterning process because the ultraviolet light is absorbed by the silicon nitride.

Conversely, as may be observed via the plot 201, the amorphous silicon making up the sacrificial layer exhibits a much smaller bandgap which may be tailored all the way down to approximately 1.3 or 1.4 electron volts. Consequently, the film will very strongly absorb the laser light and because the laser light is absorbed more readily the film is significantly easier to remove.

By designing a substantial difference between the amount of laser power required to remove the amorphous silicon sacrificial layer versus the underlying silicon nitride SiNx layer it is possible to remove the top amorphous silicon sacrificial layer without causing excessive damage to the crystalline silicon structure of the silicon nitride SiNx layer below.

Having now patterned the amorphous silicon the potential solar cell being manufactured is then placed into a hydrofluoric acid with a buffer chemical. The buffer chemical is utilized to make the process stable over time, however the hydrofluoric acid actually causes the removal of the hue.

The amorphous silicon does not etch in hydrofluoric acid however, the silicon nitride SiNx layer does etch, and therefore, depending on the manner by which the silicon nitride is deposited, the SiNx layer will either etch very quickly or very slowly or moderately quickly.

According to described embodiments, the silicon nitride SiNx layer is deposited via plasma-enhanced chemical vapor deposition, PECVD, process which enables the SiNX to be easily removed with the hydrofluoric acid prior to any high temperature processes.

According to one embodiment, following the amorphous silicon patterning operation (e.g., FIG. 1 at element 120) the solar cell being manufactured is exposed to a 10:1 buffered oxide etch which contains hydrofluoric acid for 5 minutes to remove the silicon nitride where it caused damage to the amorphous silicon leaving behind a non-ideal amorphous silicon layer on top of the silicon nitride layer which will absorb light and decrease the efficiency of the solar cells.

Therefore, the substrate is then returned to the PECVD tool, however, rather than running a depositing plasma or plasma that deposits material, an etching plasma operation is run using a relatively low power hydrogen plasma. This etching plasma operation removes the amorphous silicon because the amorphous silicon already has a significant quantity of hydrogen within it and therefore, by hitting the amorphous silicon layer with hydrogen atoms via the etching plasma, the remaining amorphous silicon is removed as it reverts back to the silane SiH4 gas originally utilized to deposit the film.

The molecular bonds of silicon nitrogen are significantly stronger than the bonds of silicon hydrogen and consequently, the silicon nitride film does not change in thickness via this process and it would be very difficult to remove the silicon nitride film with hydrogen plasma etch due to the high preference whereas removal of the amorphous silicon film is very easy to remove via the hydrogen plasma etch (e.g., as depicted at FIG. 1, element 135).

It is not necessary to utilize a hydrogen plasma etch and in accordance with alternative embodiments a different etch is utilized in place of the hydrogen plasma etch.

With the removal of the amorphous silicon film via the hydrogen plasma etch the crystalline silicon with the patterned silicon nitride remains behind with nothing else, thus leaving the desired patterned silicon nitride film.

According to a particular embodiment, a light-induced plating process is then utilized to deposit the metal contacts and because there is no damage or only minimal damage to the crystalline silicon a much higher efficiency solar cell with very small metal contacts defined with laser is provided.

Figure 3:
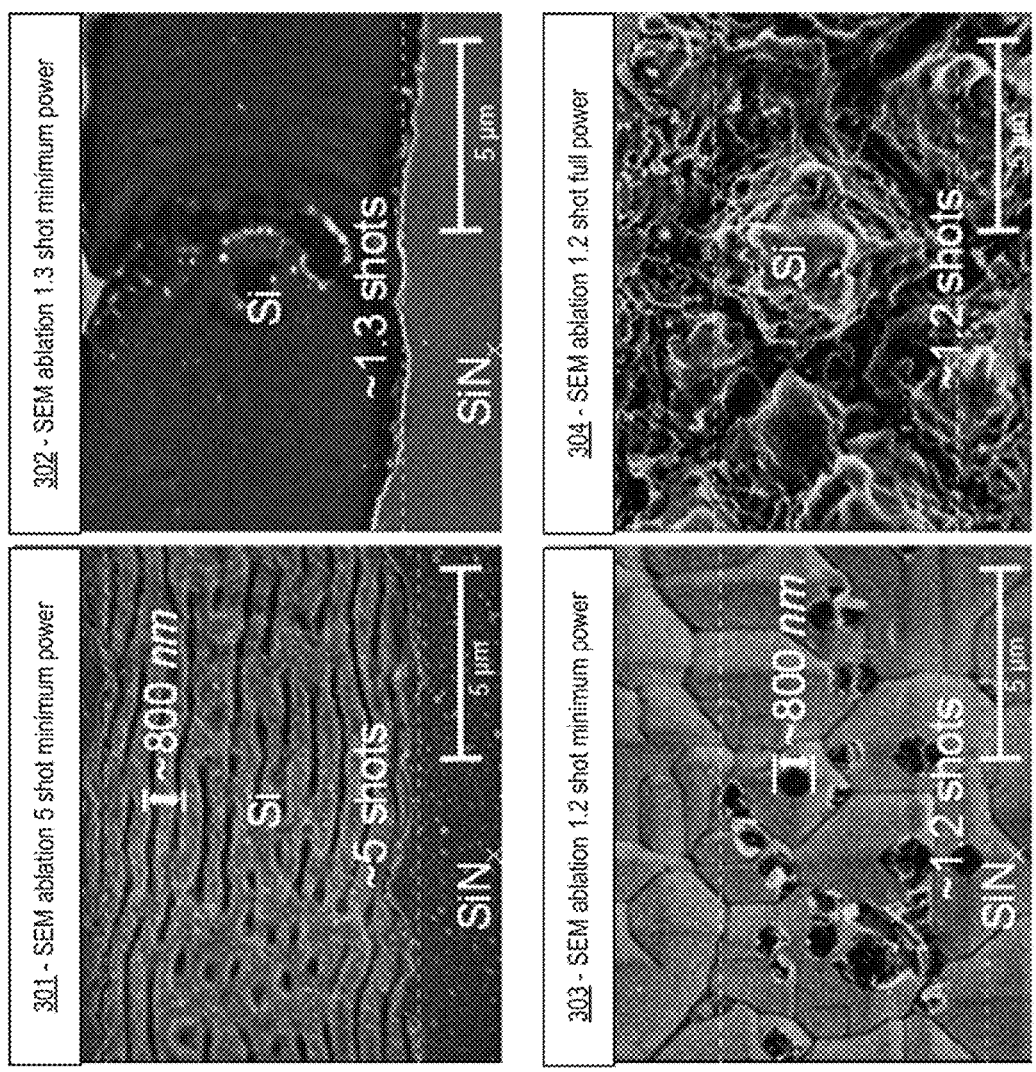
FIG. 3 depicts Scanning Electron Microscope (SEM) laser ablation images in accordance with described embodiments.

FIG. 3 depicts SEM laser ablation images in accordance with described embodiments. Specifically depicted are an SEM image 301 of a laser ablation spot ($\lambda$=800 nm) after 5 shot minimum power $SiN_x$ ablation on smooth Is. At element 302 there is depicted an SEM image 1.3 shot minimum power $SiN_x$ ablation. At element 303 there is depicted an SEM image of 1.2 shot minimum power ablation of $SiN_x$ on alkaline textured Si. And at element 304 there is depicted an SEM image of 1.2 shot minimum power full ablation of $SiN_x$ on alkaline textured Si.

As depicted, the 1.2 shots (SEM image 303) and 1.3 shots (SEM image 302) indicate a 20% and 30% spot overlap, respectively. The 5 shots (element 301) indicate that each location in the laser line was exposed to 5 shots from the laser. Overlaps of 20 and 30% are used in order to achieve a consistent line. Elements 301 and 302 demonstrate a direct removal of the $SiN_x$ film. Peeling at the edge of the lasing site indicates that the film is lifted off from the underlying c-Si from c-Si vaporization. Repeatable film removal on smooth substrates is achievable with $P_d=264$ $GW/cm^2$ as seen in SEM image 301 with multiple laser shots per location but this results in periodic trenching every 800 nm which corresponds to the wavelength of the laser. Such trenching potentially degrades the device performance of the solar cell by perforating the emitter. Operating under the assumption that the $SiN_x$ film removal is the result of vaporization of the underlying c-Si and a more energetic vaporization would result in more successful film removal, the laser intensity was increased at SEM image 302. Specifically, the intensity was increased to 834 $GW/cm^2$, and the shot repetition was limited to ~1. The single shot approach was demonstrated to remove the periodic trenching.

With the introduction of alkaline texturing and the associated laser intensity variation, the direct removal of the $SiN_x$ becomes more challenging. The same 834 $GW/cm^2$ power density that fully removed the SiNx in SEM image 302 resulted in partial ablation in SEM image 303 and an increased laser intensity of 1 $TW/cm^2$ results in the ablation seen in SEM image 304. While trenching is avoided in SEM image 304, it is evident from the SEM imaging that the c-Si surface has been damaged. Direct removal of $SiN_x$ on alkaline textured silicon therefore leaves a defect rich surface.

As can be observed here at element 304, the cone or pyramid shape is very pitted and ragged, which reduces efficiency of the resulting solar cell.

With conventional processing, there is a balance which must be found between the more complete removal of the film and consequently inducing greater damage into the textured silicon substrate versus causing less damage, but leaving behind portions of the film which also reduces efficiency of the resulting solar cell.

With an increase in laser power there will be more film removed, but also an increase the amount of damage to the silicon substrate.

Figure 4:
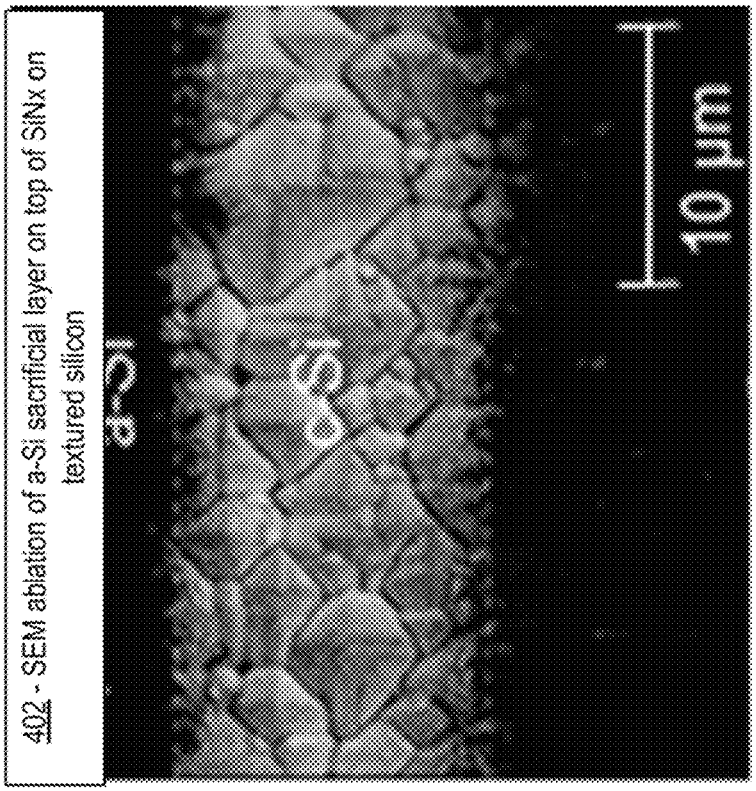
FIG. 4 depicts SEM laser ablation images from indirect laser removal processing in accordance with described embodiments.
Figure 4:
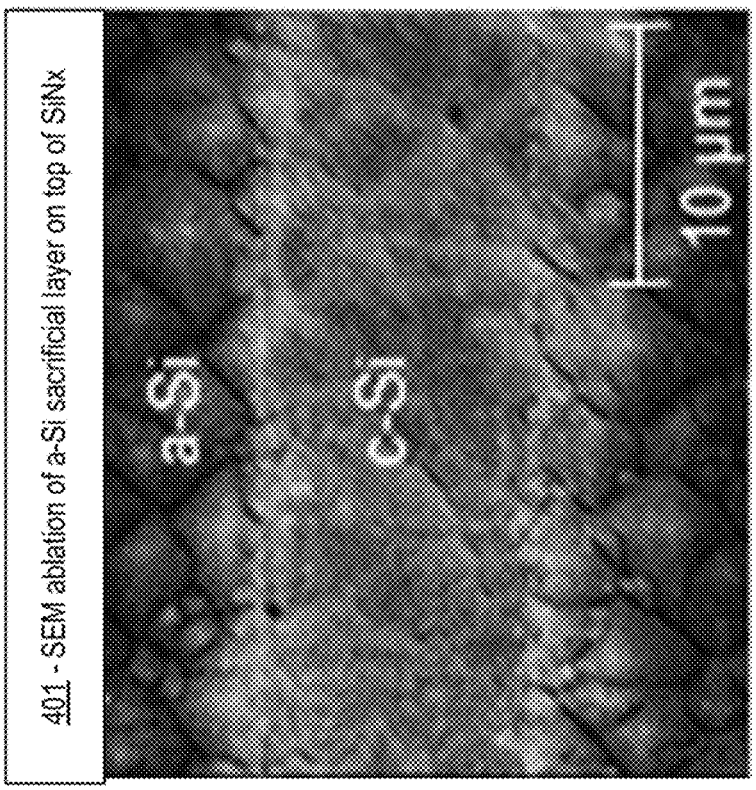

FIG. 4 depicts SEM laser ablation images from indirect laser removal processing in accordance with described embodiments. Specifically depicted are SEM image 401 of a laser ablation line ($\lambda$=800 nm) of an a-Si sacrificial layer on top of $SiN_x$ on textured Si with 0.8 mW time average power and SEM image 402 of a laser ablation line of a-Si on top of $SiN_x$ on textured silicon after a 2 minute BOE.

Where the direct laser removal process depicted at FIG. 3 element 301 results in incomplete ablation and the direct laser removal process depicted at FIG. 3 element 304 results in surface damage, an alternate processing scheme is therefore proposed. The etch rate of $SiN_x$ films is demonstrated to decrease as the $NH_3/SiH_4$ deposition gas ratio decreases such that as the ratio approaches zero so does the etch rate. Coupled with the bandgap of a-Si as depicted at FIG. 2, an a-Si etch mask may therefore be utilized as depicted at FIG. 1.

Amorphous silicon is a poor conductor but it does conduct electrons. Conversely, silicon nitride is an extremely poor conductor. As can be seen here at element 402 the amorphous silicon has been mostly removed and the surfaced is no longer visible. When the solar cell being manufactured is then placed into the hydrofluoric acid the silicon nitride is removed. After removal of the silicon nitride it is then possible to see the surface again, thus exposing the alkaline texturing and resulting in greater film removal with significantly less damage to the silicon substrate.

By patterning the 5 nm a-Si with the laser before firing the $SiN_x$, HF may thus be utilized to selectively remove the $SiN_x$ where the a-Si has been ablated. If the a-Si is incompletely ablated, then etch time is extended to undercut the residual film and fully open the contact without visible surface defects.

As is depicted by the SEM images 401 and 402, the film stack now demonstrates charging, when imaged with SEM, where the laser has removed the top layer of the film. After the underlying $SiN_x$ film has been exposed by the laser, the substrate (c-Si with its film stacks) is submerged in BOE, comprised of, by way of example, $NH_4F$ and HF for 7 minutes in accordance with a particular embodiment. In other embodiments, $SiO_x$ functions as the film to be removed. Alternative etch processes may likewise be utilized to optimize the etch as well.

Such a chemical etch results in the removal of SiNx (or $SiO_x$) only where the a-Si has been removed by the laser. The a-Si film is then removed with a low power $H_2$ plasma etch in the PECVD tool. The $H_2$ plasma etch does not etch the $SiN_x$ or SiOx films, resulting in a fully patterned dielectric film with no absorbing a-Si layer. The patterning depicted at SEM images 301-304 at FIG. 3 from direct ablation of $SiN_x$ without the chemical masking as depicted at SEM images 401 and 402 results in either incomplete ablation such as that which is depicted by SEM image 301 at FIG. 3 or substantial damage to the c-Si lattice such as that which is depicted by SEM image 304 at FIG. 3. Conversely, use of the chemical masking as depicted at SEM images 401 and 402 results in no visible damage and near complete removal of the film where desired.

The white distortion and blurring in depicted at SEM image 401 demonstrates the charging of the local opening in the a-Si film from the laser ablation of the film. The charging is indicative of a non-conductive film and is the result of exposure of the underlying $SiN_x$ film. SEM image 402 contains a much clearer image, as the $SiN_x$ film has been locally removed with BOE. The a-Si film is then removed with a low power hydrogen plasma, leaving the $SiN_x$ intact.

The 5 nm a-Si mask does not prove to be robust enough for fully blocking HF across the substrate, and causes the formation of pinholes in the $SiN_x$ film. Pinholes coupled with Light-Induced-Plating (LIP) lead to ghost plating which is the deposition and growth of metal in non-contact locations. Ghost plating reduces finger conductivity, causes pattern loss, and shades the cell, all of which are undesirable and degrades efficiency and power generation of the resulting cell.

Figure 5:
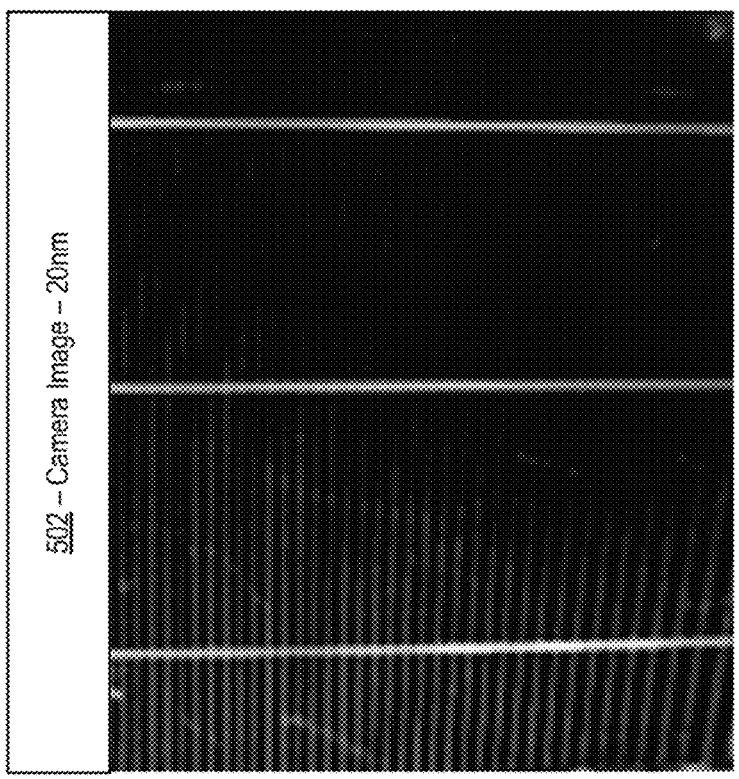
FIG. 5 depicts camera images of plated cells.
Figure 5:
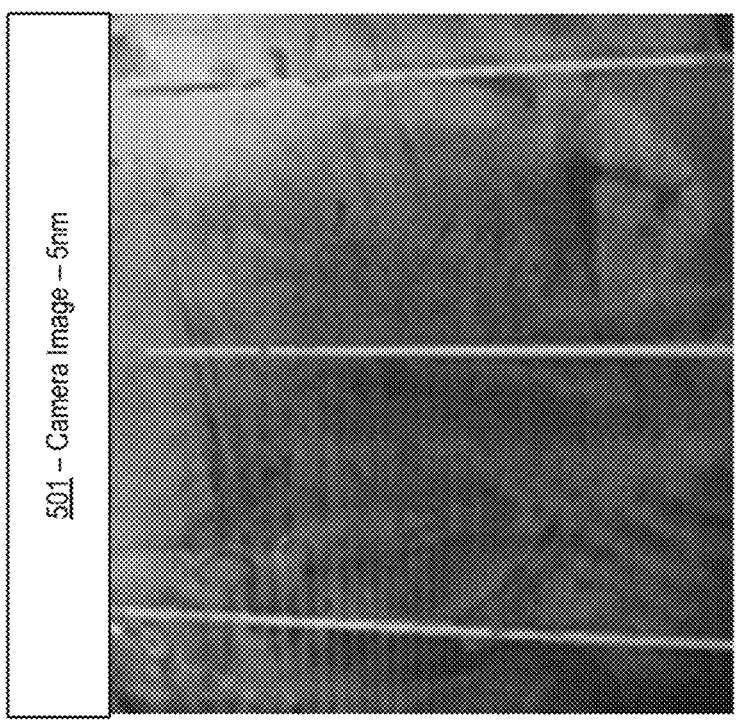

FIG. 5 depicts camera images of plated cells. Specifically depicted are a camera image 501 of a plated cell with a 5 nm a-Si etch mask and camera image 502 of a plated cell with a 20 nm a-Si etch mask in accordance with described embodiments.

The cells pictured at camera images 501 and 502 were formed using the indirect laser removal process 101 as depicted at FIG. 1, followed by LIP Ni and Cu on c-Si(p) bulk cells with a bulk resistivity of 1-3 ohm-cm and an n-type emitter with a sheet resistance of 60 ohms/square. The cell pictured at camera image 501 has substantial ghost plating and pattern loss whereas the cell pictured at camera image 502 does not. The increase in the a-Si mask thickness decreases the non-contact area plating, but it also makes laser removal of the a-Si more challenging with the same laser intensity.

Figure 6:
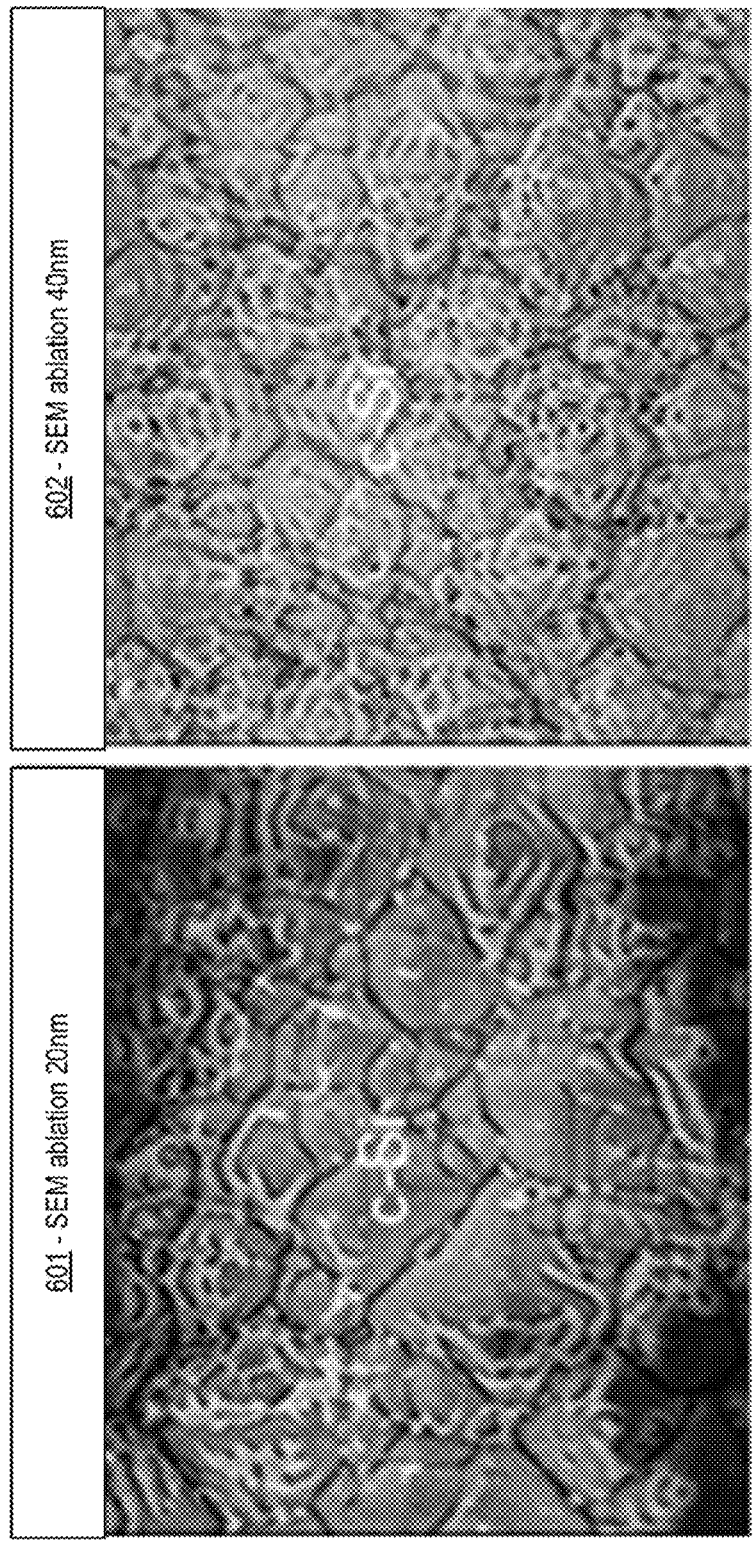
FIG. 6 depicts SEM images of laser ablation.

FIG. 6 depicts SEM images of laser ablation. Specifically depicted are SEM image 601 of a laser ablation line with 20 nm a-Si etch mask after BOE etch and SEM image 602 of a laser ablation line with 40 nm a-Si etch mask after BOE in accordance with described embodiments. For a fixed laser intensity of 210 GW/cm$^2$ an increase in a-Si film thickness causes an increase in the residual film after processing as is further depicted at FIG. 7.

Figure 7:
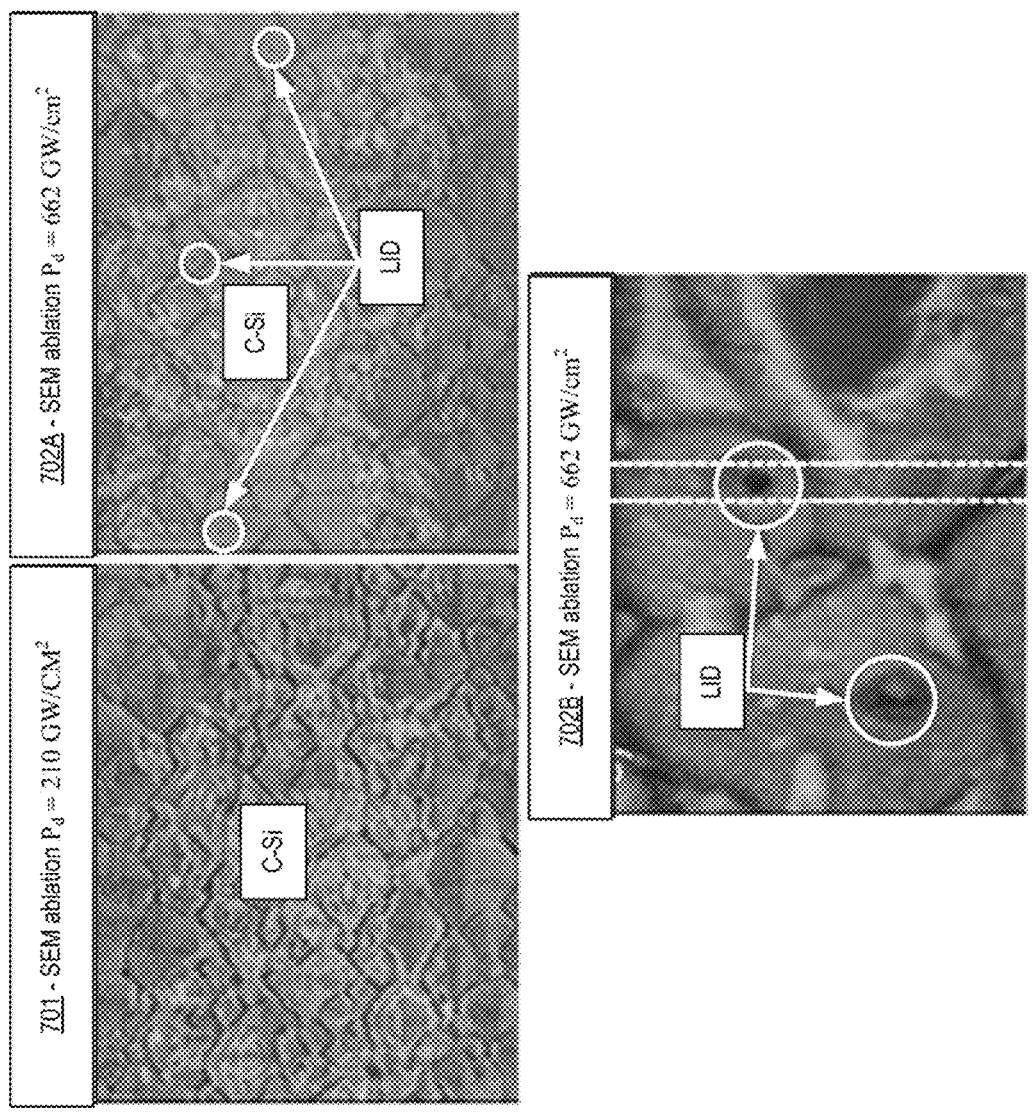
FIG. 7 depicts SEM images of laser ablation.

FIG. 7 depicts SEM images of laser ablation. Specifically depicted are SEM image 701 of a laser ablation line with 40 nm a-Si etch mask after BOE and H2 plasma etch with $P_d$=210 GW/CM$^2$ and SEM image 702A of a laser ablation line with 40 nm a-Si etch mask after BOE and H$_2$ plasma etch with $P_d$=662 GW/cm$^2$, and SEM image 702B of laser ablation line with 40 nm a-Si etch mask after BOE and H2 plasma etch with $P_d$=662 GW/cm$^2$ under higher magnification.

Each of SEM images 701 and 702A and 702B share the same BOE etch time and demonstrated that an increase in laser intensity increases the local opening in the SiN$_x$ for a fixed BOE etch time. Unfortunately, close inspection SEM images 702A and 702B show the emergence of small visible laser induced defects (LID) at the peaks of the pyramids as indicated by the red circles in SEM image 702A. The white lines bounding the defect in SEM image 702B shows the defect is ~200 nm in diameter, a quarter the wavelength of the laser.

SEM image 701 with its 20 nm mask has substantially less film residue after the BOE process compared to the 40 nm mask in SEM image 602 at FIG. 6. Eventually the increase in mask thickness will completely obscure the contact region for plating, and prevent proper contact to the emitter (the top layer of the c-Si solar cell).

Where the a-Si layer acts as a shield for the c-Si and sufficiently absorbs the laser to prevent damage of the underlying substrate, then higher laser powers may be utilized to process and remove the residual film without causing damage.

Figure 8:
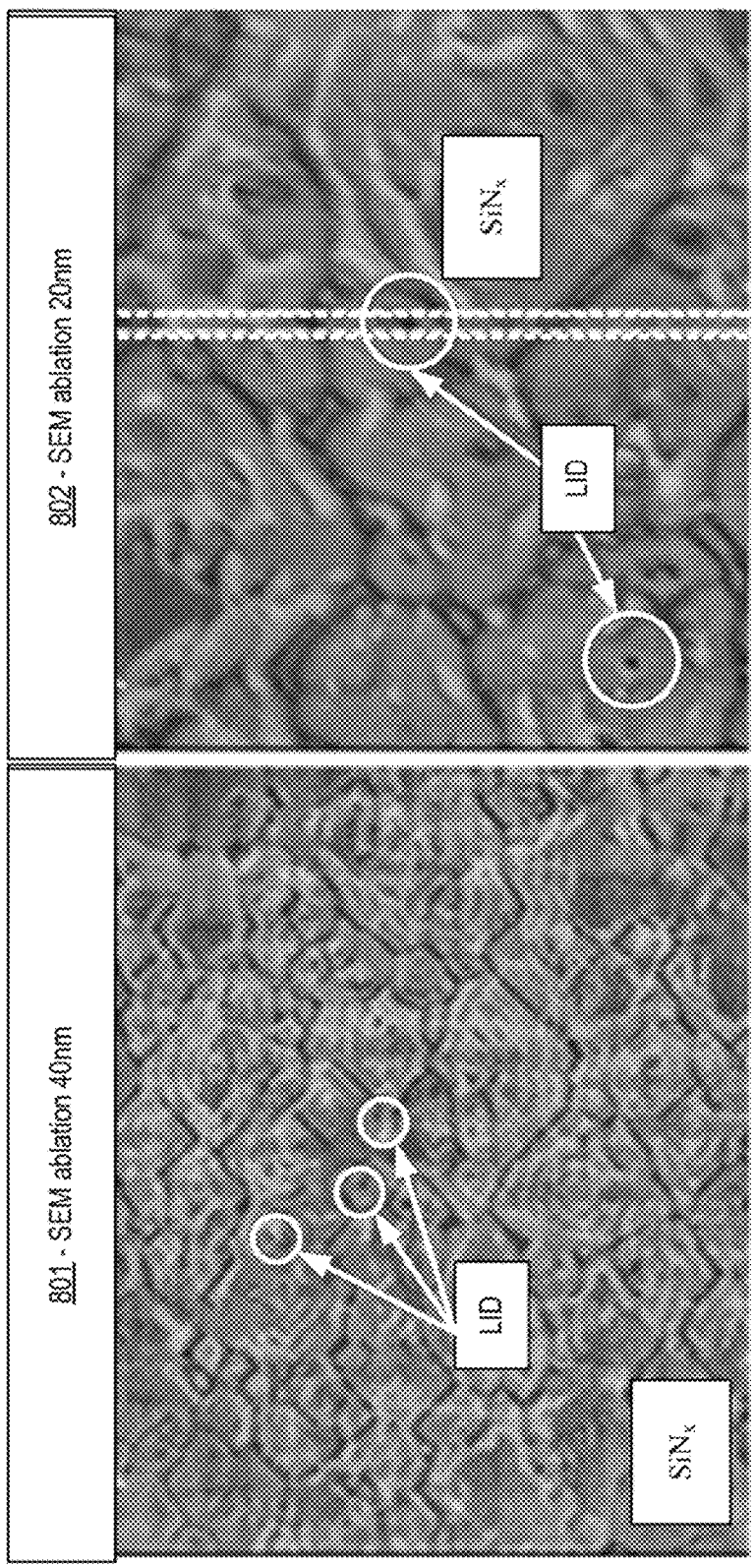
FIG. 8 depicts SEM images of laser ablation.

FIG. 8 depicts SEM images of laser ablation. Specifically depicted are SEM image 801 of finger/busbar intersection with 40 nm a-Si etch mask after BOE and H$_2$ plasma etch with $P_d$=210 GW/CM$^2$ and SEM image 802 of finger/busbar intersection with 20 nm a-Si etch mask after BOE and H2 plasma etch with $P_d$=210 GW/CM$^2$.

Although the low intensity finger contact opening in figure SEM image 701 at FIG. 7 generated no visible defects, the same sample exhibits defects where the laser pulses overlap (e.g., where the fingers and busbars intersect). SEM images 801 and 802 show the defects generated at this intersection resultant from pulse overlap. Such behavior is similar to the defect generation observed at SEM image 301 of FIG. 3 for smooth surfaces. The white lines in SEM image 801 show the approximate size of the defects to again be ~200 nm.

Where the laser pulse exposure overlaps with a previous laser pulse exposure there is a double pulse of intensity resulting in the small pit holes. Because the laser applied is a pulsed laser, at a given frequency, there is a short but more intense and localized burst of energy.

Conversely, continuous wave lasers where the laser is always on result in an entirely a thermal process. Similarly, at pulsed millisecond pulsed and microsecond pulsed lasers the effect may as well be continuous as the results are the same. However, beginning with nanosecond pulses then are changes. Using the nanosecond pulsed laser frequency it is possible to more finely control how deep the heat goes into the surface before it becomes distributed so widely that there is no difference. In the picoseconds range the laser has a very shallow heat profiles, but they remain a heat removal process.

At this femtosecond range, different behaviors are observed such that the process for removing or damaging anything exposed to the laser becomes a plasma process rather than a heat process due to having generated so many high energy electrons in the material that the electrons are breaking bonds resulting in outgassing and permitting the material to be removed via a non-thermal process.

By introducing the amorphous silicon layer as a sacrificial layer, the amorphous silicon is effectively silicon, however, because it is weakly bound silicon, the amount of energy needed to get an electron to break a bond is much lower. By having the laser light absorbed in the amorphous layer, these energetic electrons are generated which break the bonds to create a plasma resulting in plasma ablation without damaging the pristine crystalline silicon structure which must remain for optimal solar cell operational efficiency.

Figure 9:
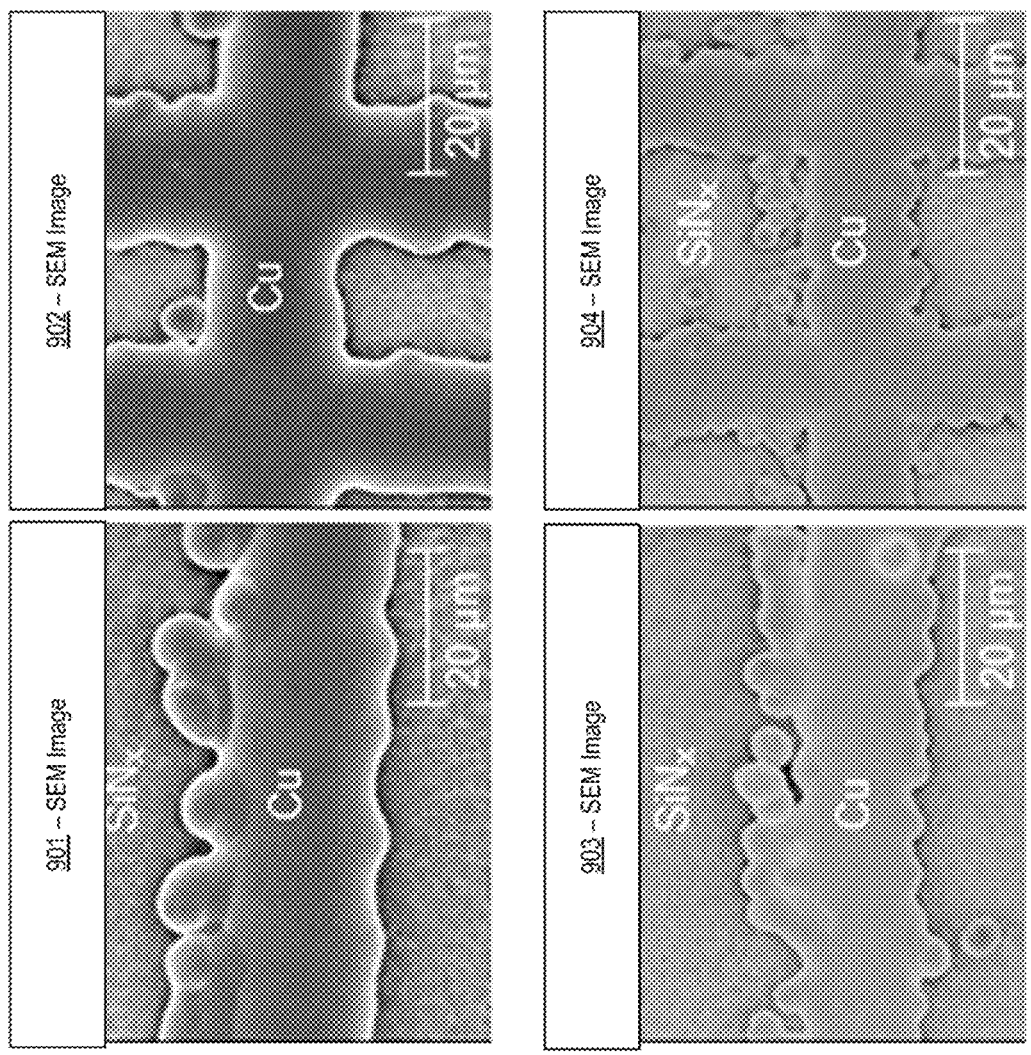
FIG. 9 depicts SEM images with and without ghost plating.

FIG. 9 depicts SEM images with and without ghost plating. Specifically depicted are SEM image 901 of a finger without ghost plating, SEM image 902 of a finger/busbar intersection without ghost plating, SEM image 903 of a finger with ghost plating, and SEM image 904 of a finger/busbar intersection with ghost plating.

SEM images 901 and 902 show the formation of 20-25 micron micro-wires with an 8-12 micron SiN$_x$ opening without the presence of ghost plating. SEM images 903 and 904 show the presence of ghost plating and the effect it has on finger formation. As the a-Si etch mask becomes too thin, pinholes formed in the SiN$_x$ as a result of pinholes in the a-Si etch mask. These pinholes re-directed the plating current from the LIP process and reduced the conductivity, width, and consistency of the micro-wires. The spacing between the wires in SEM images 902 and 904 that comprise the busbar reduces the film stress in the busbar and improves metal adhesion. Samples without this spacing would experience peeling at the busbar after a 5 minute 350° C. anneal, samples with adequate spacing to prevent wire-merging did not have this issue.

Generation of abundant surface defects for direct laser ablation of SiN$_x$ on alkaline textured c-Si with a femtosecond laser have been demonstrated. The large bandgap of SiN$_x$ results in the film being very challenging to remove with sub-bandgap photons on a textured surface. The described approach both reduced the generation of visible defects and is demonstrated to have an effective contact opening for light induced plating.

The reduction of damage decreases the need for post-ablation damage etches or selective emitter doping. Applications for the described process thus allow for the patterning of both SiN$_x$ and SiO$_x$, enabling selective doping for local openings without the need for additional equipment to support resist patterning steps.

Enhancing the absorption of the laser in the a-Si may further decrease the power required for film ablation, reduction in c-Si damage, and minimize residual film at the contact location. Furthermore, a lighter doped n-region may improve passivation of the emitter.

Figure 10:
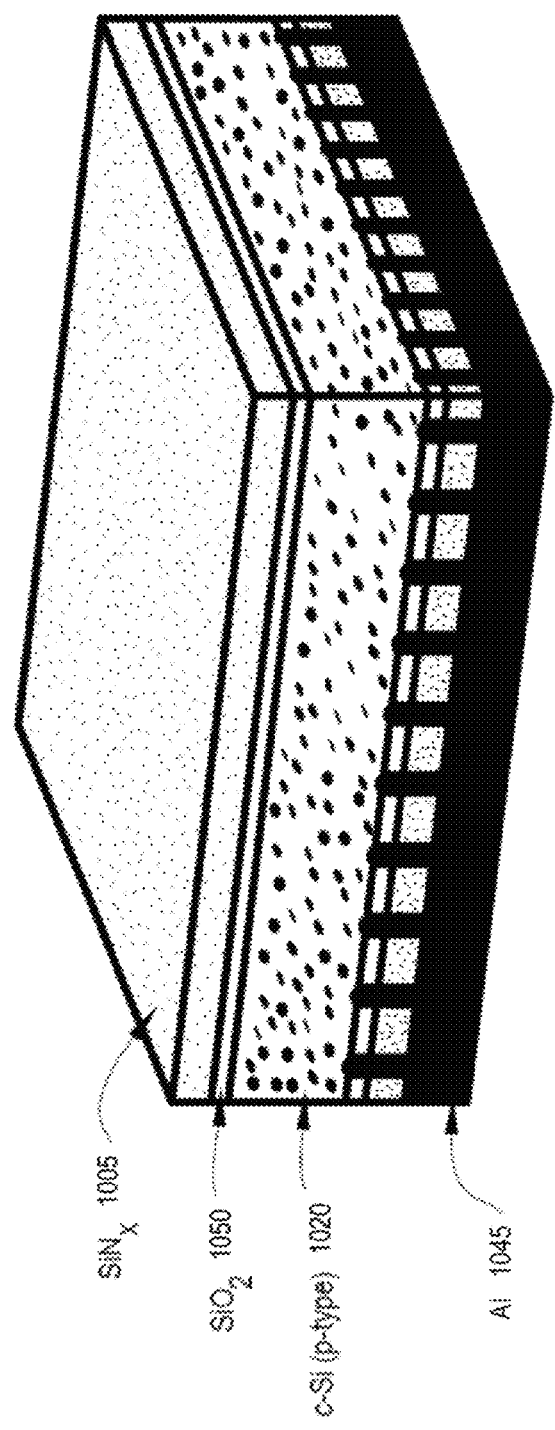
FIG. 10 depicts a Passivated Emitter Rear Contacted (PERC) cell for which there is selected doping, contact doping, and back contacted cells.

FIG. 10 depicts a depicts a Passivated Emitter Rear Contacted (PERC) cell 1001 for which there is selected doping, contact doping, and back contacted cells. In particular, an exemplary solar cell resulting from the above described processes may be observed, in which there is a bottom Al base layer 1045 upon which a c-Si (p-type) substrate layer 1020 is provided, over which a $SiO_2$ layer 1050 is depicted and finally at the top surface a $SiN_x$ layer 1005 is provided.

Figure 11A:
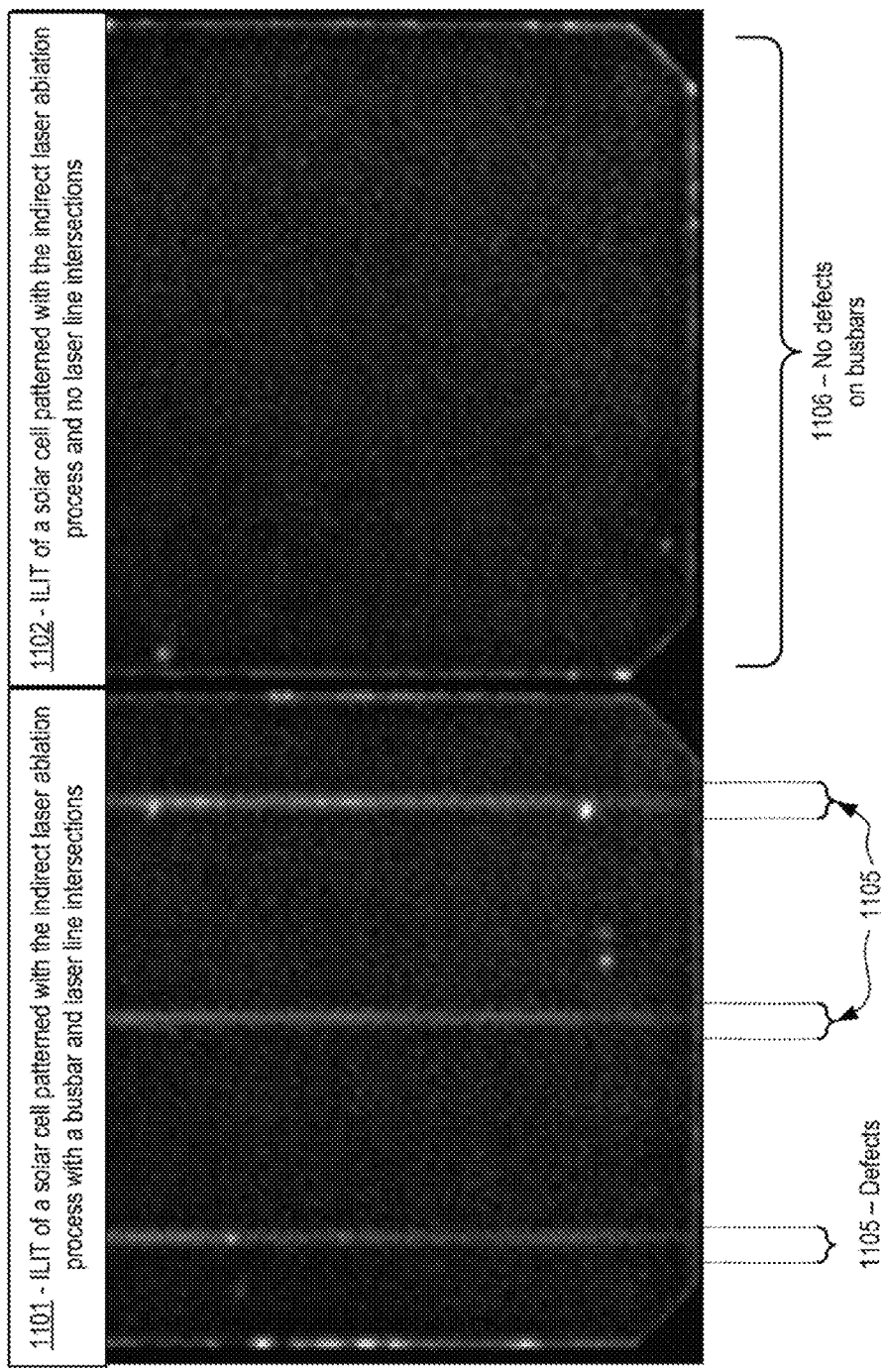
FIG. 11A shows a solar cell under Illuminated Lock In Thermography (ILIT) in accordance with described embodiments.

FIG. 11A shows a solar cell under Illuminated Lock In Thermography (ILIT) in accordance with described embodiments.

More particularly, on the left at element 1101 there is depicted ILIT imagery of a solar cell patterned with the indirect laser ablation process with a busbar and laser line intersections which have caused defects 1105 along the intersection of the laser and busbar as illuminated via the ILIT imagery. On the right at element 1102 there is depicted ILIT imagery of a solar cell patterned with the indirect laser ablation process prior to the placement of the busbar and consequently, there are no defects 1106 and there are no laser line intersections with the busbars.

The small defects 1105 observed the ILIT image 1101 are a likely source of shunting. Conversely, the lack of bright spots in ILIT image 1102 indicates that removing the busbar—and laser line intersections with it—eliminates the shunts in the cell which will therefore result in a more efficient solar cell as captured energy is converted to electrical output rather than converted to wasteful heat due to the shunts.

Typically the small laser induced defects (LIDs) exhibit a relatively low defect density. Ideally any defects which due occur are shallow enough that they won't perforate the emitter of a silicon solar cell under manufacture as it will reduce the operational efficiency of the same solar cell once in operation. Any apparent shunting as a result of defects 1105 appear as a bright spot from localized heating.

The bight spots identified at element 1101 as defects 1105 are thus a likely source of shunting.

Figure 11B:
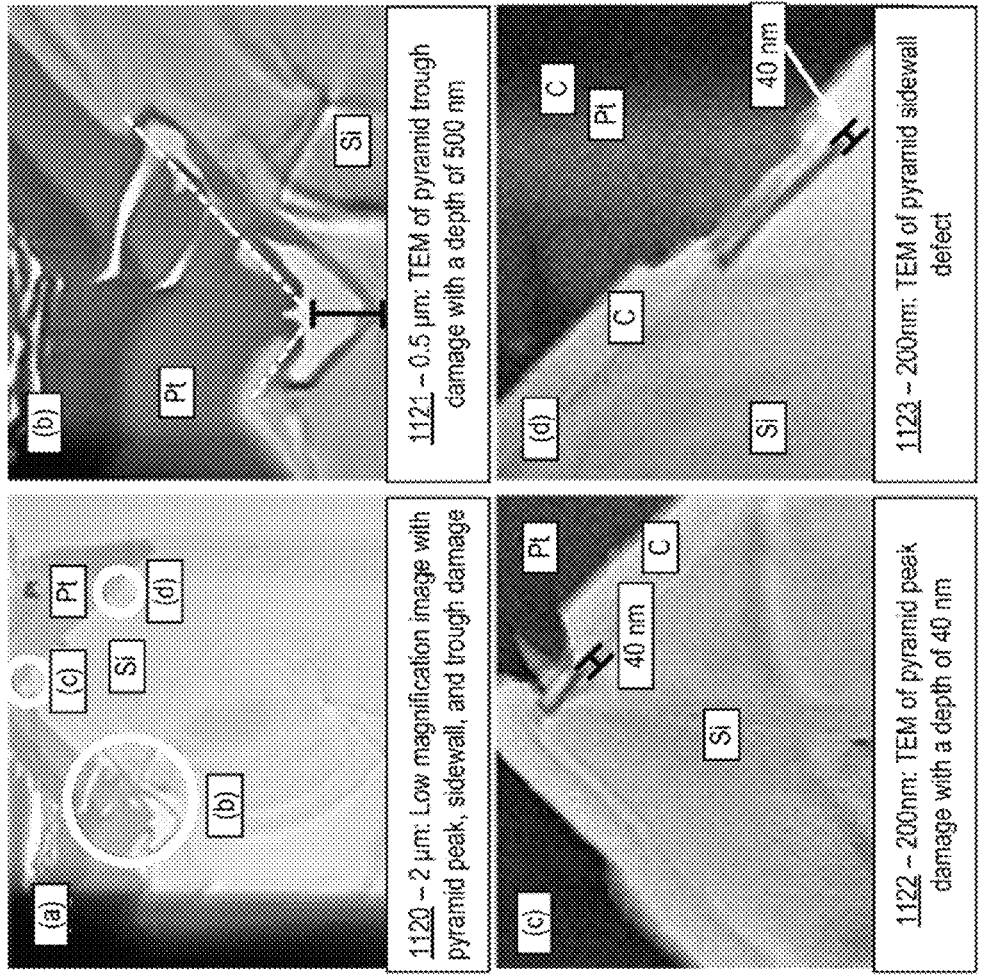
FIG. 11B shows a solar cell under Transmission Electron Microscopy (TEM) in accordance with described embodiments.

FIG. 11B shows a solar cell under Transmission Electron Microscopy (TEM) in accordance with described embodiments. Specifically depicted is a cross sectional TEM image of laser line intersection with Laser Induced Damage or "LIDs."

More particularly, on the top left at element 1120 there is depicted a TEM image at a scale of 2 microns showing pyramid peak, sidewall, and trough damage. On the top right at element 1121 is a TEM image at a scale of 0.5 microns showing pyramid trough damage with a depth of 500 nanometers. On the bottom left at element 1122 at a scale of 200 nanometers is a TEM image of pyramid peak damage with a depth of 40 nm. On the bottom right at element 1123 is a TEM image at a scale of 200 nanometers showing a pyramid sidewall defect.

From TEM image (b) at element 1121 it may be observed the meeting of a small pyramid with a large pyramid resulting in an approximately ~500 nm deep defect. Other defects on the peaks and sidewalls of the pyramids in TEM image (c) at element 1122 and TEM image (d) at element 1123 only penetrate ~40 nm into the emitter. Considering that many diffusions for n-type emitters are 350-500 nm in depth, the defect in TEM image (b) at element 1121 could cause substantial shunting as demonstrated via the defects 1105 at FIG. 11A, especially when combined with a Ni silicidation process.

Investigation utilizing the TEM imagery of the busbar/finger intersection indicates the source of the shunting defects 1105 observed in FIG. 11A at element 1101. There are a series of varied defects in as depicted at FIG. 11B, most of which are approximately ~40 nm deep. The random nature of the size and distribution of the pyramids occasionally causes an interaction with the laser (constructive interference) with a sufficient intensity to form a deeper defect thus resulting n the shunt defects 1105 depicted and causing a reduce efficiency of the solar cell due to the defects resulting in heating rather than conversion to electrical output.

As described above, patterning of the silicon nitride (SiNx), silicon oxide (SiOx), and hydrogenated amorphous silicon (a-Si:H) on silicon solar cells is desirable for improving their efficiencies through processes such as selective diffusions and precise metallization. Photolithography is a well-developed standard in integrated chip manufacturing, however, can be expensive for implementation in industrial production of solar cells. Laser patterning provides a cheaper alternative to photolithography, but conventionally would create defects in textured surfaces. Although some low damage techniques are known to reduce the effects of laser induce defects, whether corresponding to those shown on the busbar and laser line intersection or those described above with defects induced within the crystalline silicon structure itself, the previously known techniques simply do not completely eliminate defects and result in inefficiency of the solar cell under manufacture below that which is attainable utilizing the techniques as are described herein.

The effects of effect of shunting can be reduced by using deep emitters, however, deep emitters cause a loss in the open-circuit voltage (VOC) and short-circuit current density (JSC) making them undesirable. However, the lighter doped the emitter, the less this effect is prevalent. As such, simulations are utilized to estimate the performance of assumed emitters with varied dopant concentrations and depths. Normally emitters are limited to relatively high surface concentrations that degrade the cell performance when driven deeper, however, it is possible to maintain mΩ·cm2 contact resistivities with surface concentrations as low as 4E18 cm-3 with nickel silicide.

According to certain embodiments, LID defects attributable to the intersection of the laser patterning and the busbar are removed entirely by creating an effective busbar with an alternative technology, such as press on tin coated-copper wires.

The influence of defects on the performance of the solar cell largely depends on the profile of the emitter, and not just the sheet resistance of the emitter. A series of <100> polished p-type mono-crystalline boron doped wafers with a bulk resistivity of 2.5 Ω·cm and a thickness of ~675 microns were diffused with the varying parameters and characterized with spreading resistance analysis.

Those samples patterned in the manner described herein do not exhibit defects except for locations that are scanned with the laser twice thus resulting in the depicted defects 1105 at the intersection of laser lines where the a-Si:H mask has already been removed by previous laser pulses thus demonstrating a valuable improvement in efficiency due to the lack of defects except where the busbar intersects if the busbar is present when patterned or even the total removal of defects where the busbar is not present when patterned with the laser, thus preventing the LID defects at the laser line and busbar intersection entirely as is depicted at FIG. 11A element 1106.

Generally speaking, a shunt defect is the result when the front side of the solar cell contacts the back side of the solar cell. More specifically, the defect is a result of shunting the solar cell emitter which causes a drop in cell performance because the shunt resistance drops which results in hot spots due to the conversion of energy to heat rather than electrical output.

Therefore, in accordance with certain embodiments, the busbar is not patterned by the laser thus avoiding the laser line intersection with the busbar which result in the LID defects.

There is functionally no reason to laser pattern the busbar and it has been observed that increased performance results when the busbar is not laser patterned.

Therefore, in accordance with certain embodiments, the laser patterning of the solar cell is conducted without patterning the busbar and the busbar is therefore put down via a different method, such as via the replacing of the busbar with press on tin coated copper wires.

Figure 12:
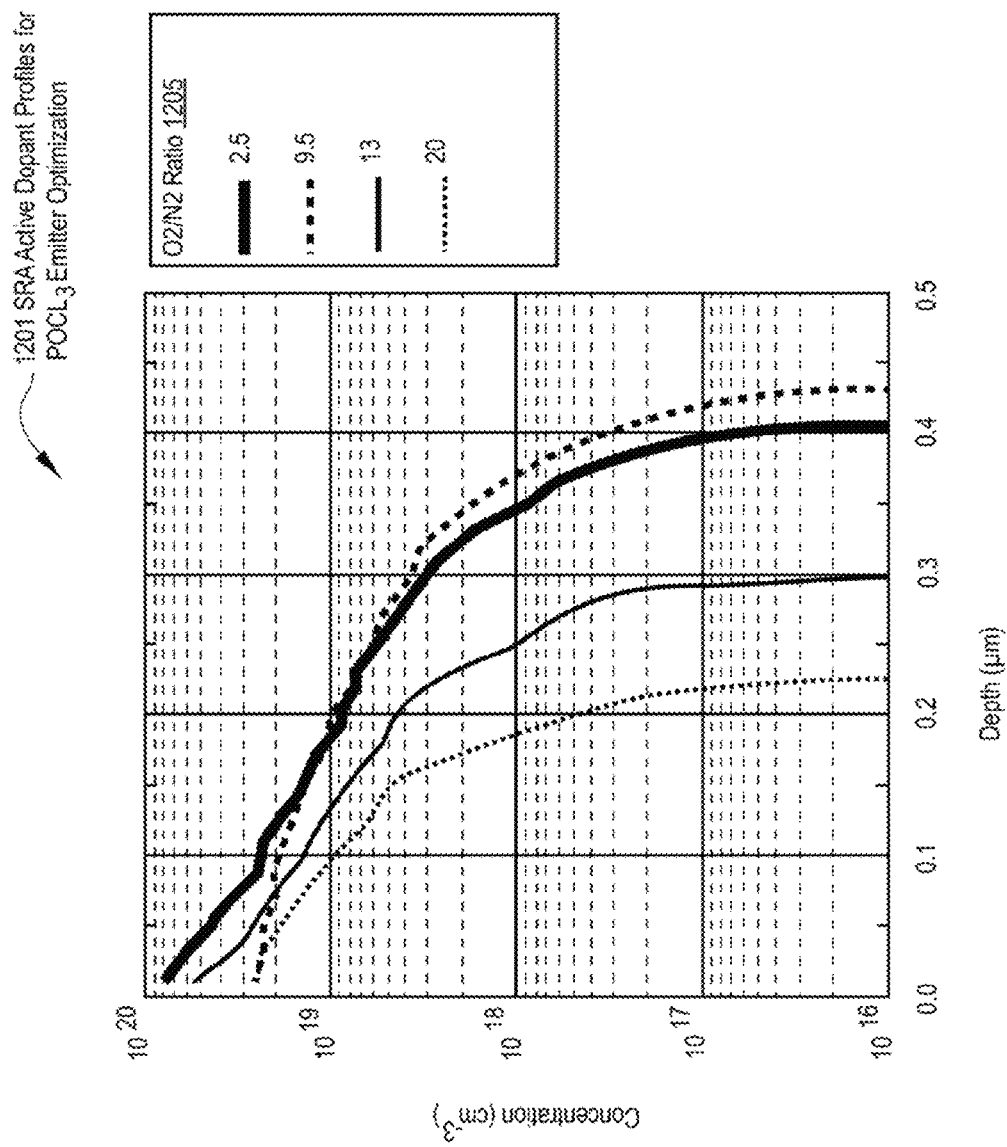
FIG. 12 depicts Spreading Resistance Analysis (SRA) of active dopant profiles for POCl₃ emitter optimization.

FIG. 12 depicts Spreading Resistance Analysis (SRA) 1201 of active dopant profiles for $POCl_3$ emitter optimization. In particular, polished p-type silicon wafers were processed and analyzed with SRA resulting in the SRA analysis shown here having profiles resulting from the varied O2/N2 carrier gas ratio 1205 with concentration ($cm^{-3}$) on the vertical axis and depth in microns ($\mu m$) on the horizontal axis.

Consequently, the finger/busbar intersection resulted in defects that fully perforated all of the emitters depicted via the SRA 1201 profile. Removal of the busbar pattern from the solar cell under manufacture solves this problem and then the adoption of a multi-wire approach to make contact with the fingers of the solar cell provides the necessary electrical connectivity. According to such an embodiment, the multi-wire solution (eliminating the patterning of the busbar) offers several advantages over a busbar design including the elimination of contact resistance and shunt resistance of the resulting solar cell which therefore will exhibit greater efficiencies in terms of increased electrical output.

As can be observed via the SRA profile 1201, the defect goes 500 nanometers deep, from the first dotted line the depth of the defect can be seen to be approximately 0.2 microns. The next line to the right shows a defect with a depth of approximately 0.3 microns. The next depth is shown at approximately 0.4 microns and the last is shown with a depth of approximately 0.44 microns.

The 500 nanometer deep defect goes through every single one of these meaning that a front region of the solar cell will be shorted to the back region by the metal contacts deposited on the surface, thus negatively affecting performance of the solar cell manufactured.

FIG. 13 is a flow diagram 1300 illustrating a method for implementing damage-and-resist-free laser patterning of dielectric films on textured silicon in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1300 may be utilized in a variety of combinations.

Method 1300 begins at block 1305 where the method includes depositing a Silicon nitride (SiNx) or SiOx (silicon oxide) layer onto a crystalline silicon (c-Si) substrate by a Plasma Enhanced Chemical Vapor Deposition (PECVD) processing.

At block 1310, processing includes depositing an amorphous silicon (a-Si) film on top of the SiNx or SiOx layer.

At block 1315, processing includes patterning the a-Si film to define an etch mask for the SiNx or SiOx layer.

At block 1320, processing includes removing the SiNx or SiOx layer via a Buffered Oxide Etch (BOE) chemical etch to expose the c-Si surface.

At block 1325, processing includes removing the a-Si mask with a hydrogen plasma etch in a PECVD tool to prevent current loss from the mask.

At block 1330, processing includes plating the exposed c-Si surface with metal contacts.

In accordance with another embodiment of method 1300, depositing a thin layer of a-Si on top of the $SiN_x$ or $SiO_x$ prepares the film for metallization without damaging the underlying c-Si.

In accordance with another embodiment of method 1300, the a-Si film is susceptible to laser removal, but is insensitive to the BOE chemical etch.

In accordance with another embodiment of method 1300, the underlying $SiN_x$ or $SiO_x$ film is sensitive to BOE chemical etch, but not sensitive to the laser.

In accordance with another embodiment of method 1300, removing the $SiN_x$ or $SiO_x$ layer via a low power hydrogen plasma in a PECVD tool comprises exposing the c-Si surface to expose a damage free c-Si surface.

In accordance with another embodiment, method 1300 further includes exposing the exposed damage free c-Si surface to other selective processing before plating with metal.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

What is claimed is:

1. A method comprising:
    depositing a Silicon nitride (SiNx) or SiOx (silicon oxide) layer onto a crystalline silicon (c-Si) substrate by a Plasma Enhanced Chemical Vapor Deposition (PECVD) processing;
    depositing an amorphous silicon (a-Si) film on top of the SiNx or SiOx layer;
    patterning the a-Si film to define an etch mask for the SiNx or SiOx layer;
    removing the SiNx or SiOx layer via a Buffered Oxide Etch (BOE) chemical etch to expose the c-Si surface;
    removing the a-Si mask; and
    plating the exposed c-Si surface with metal contacts.

2. The method of claim 1, wherein removing the a-Si mask comprises removing the a-Si mask with a dilute Potassium Hydroxide (KOH).

3. The method of claim 1, wherein removing the a-Si mask comprises removing the a-Si mask with a hydrogen plasma etch in a PECVD tool to prevent current loss from the mask.

4. The method of claim 1:
    wherein the a-Si film comprises a sacrificial a-Si layer deposited on top of the SiNx or SiOx layer; and wherein patterning the a-Si film to define the etch mask for the SiNx or SiOx layer comprises patterning the sacrificial a-Si layer with a laser.

5. The method of claim 4, wherein removing the a-Si mask removing the a-Si mask via a low power hydrogen plasma etch in a PECVD tool to prevent current loss from the mask, wherein the removal of the a-Si mask exposes the c-Si surface, and wherein the exposed c-Si surface is free from damage from the laser.

6. The method of claim 1, wherein depositing the amorphous silicon (a-Si) film on top of the SiNx or SiOx layer prepares the film for metallization without damaging the underlying crystalline silicon (c-Si) substrate.

7. The method of claim 1, wherein the a-Si film is susceptible to laser removal, but is non-reactive to the BOE chemical etch.

8. The method of claim 1, wherein the layer formed from SiNx or SiOx is sensitive to the BOE chemical etch, but is not sensitive to the laser.

9. The method of claim 1, wherein plating the exposed c-Si surface with metal contacts comprises plating the exposed c-Si surface with metal contacts having a size less than 20 microns in diameter or width.

10. The method of claim 1:
wherein patterning the a-Si film to define the etch mask for the SiNx or SiOx layer comprises patterning via a laser; and
wherein plating the exposed c-Si surface with metal contacts comprises depositing the metal contacts via Light-Induced-Plating (LIP) in areas defined by the patterning via the laser.

11. The method of claim 1:
wherein the method produces a solar cell under manufacture;
wherein patterning the a-Si film to define the etch mask for the SiNx or SiOx layer comprises patterning the SiNx or SiOx layer without patterning any busbar of the solar cell under manufacture; and
wherein press on tin coated copper wires are fabricated onto the solar cell under manufacture in lieu of the busbars.

12. The method of claim 1, wherein depositing the amorphous silicon (a-Si) film on top of the SiNx or SiOx layer comprises depositing the a-Si film as a sacrificial a-Si layer via a screen printing process and lithographically exposing the sacrificial a-Si layer to light.

13. The method of claim 12:
wherein lithographically exposing the sacrificial a-Si layer to light comprises patterning the patterning the a-Si film to define the etch mask for the SiNx or SiOx layer via an ultraviolet laser.

14. The method of claim 1, wherein removing the SiNx or SiOx layer via a Buffered Oxide Etch (BOE) chemical etch to expose the c-Si surface comprises removing the SiNx or SiOx layer via buffered hydrofluoric acid which etches the layer formed from the SiNx or SiOx but is non-reactive with the a-Si mask.

15. The method of claim 1:
wherein depositing the SiNx or SiOx layer onto the c-Si substrate by the PECVD processing comprises depositing the depositing the SiNx or SiOx layer via a PECVD tool; and
wherein depositing the a-Si film on top of the SiNx or SiOx layer comprises depositing the a-Si film via the PECVD tool used to deposit the depositing the SiNx or SiOx layer during one operation by changing gas flows of the PECVD tool during the one operation.

16. The method of claim 1, wherein plating the exposed c-Si surface with metal contacts comprises plating a potential photovoltaic cell under manufacture formed from the exposed c-Si surface with metal contacts, the metal contacts forming electrically conductive metallic pathways on a top surface of the potential photovoltaic cell.

17. A method of manufacturing a photovoltaic cell, wherein the method comprises:
forming a substrate of the photovoltaic cell from crystalline silicon (c-Si) to form a c-Si substrate of the photovoltaic cell;
depositing a Silicon nitride (SiNx) or SiOx (silicon oxide) layer onto the c-Si substrate by a Plasma Enhanced Chemical Vapor Deposition (PECVD) processing;
depositing an amorphous silicon (a-Si) film on top of the SiNx or SiOx layer;
patterning the a-Si film to define an etch mask for the SiNx or SiOx layer;
removing the SiNx or SiOx layer via a Buffered Oxide Etch (BOE) chemical etch to expose the c-Si surface;
removing the a-Si mask with a hydrogen plasma etch in a PECVD tool to prevent current loss from the mask; and
plating the exposed c-Si surface with metal contacts, the metal contacts forming electrically conductive metallic pathways on a top surface of the photovoltaic cell.

18. The method of claim 17, wherein depositing the amorphous silicon (a-Si) film on top of the SiNx or SiOx layer prepares the film for metallization without damaging the underlying crystalline silicon (c-Si) substrate.

19. The method of claim 17:
wherein the a-Si film is susceptible to laser removal, but is non-reactive to the BOE chemical etch; and
wherein the layer formed from SiNx or SiOx is sensitive to the BOE chemical etch, but is not sensitive to the laser.

* * * * *